(12) United States Patent
Gross

(10) Patent No.: US 9,842,665 B2
(45) Date of Patent: Dec. 12, 2017

(54) OPTIMIZATION OF HIGH RESOLUTION DIGITALLY ENCODED LASER SCANNERS FOR FINE FEATURE MARKING

(71) Applicant: nLight Photonics Corporation, Vancouver, WA (US)

(72) Inventor: Ken Gross, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 504 days.

(21) Appl. No.: 14/323,954

(22) Filed: Jul. 3, 2014

(65) Prior Publication Data
US 2014/0319381 A1    Oct. 30, 2014

Related U.S. Application Data

(63) Continuation-in-part of application No. 14/030,799, filed on Sep. 18, 2013, now Pat. No. 9,537,042, and
(Continued)

(51) Int. Cl.
| | |
|---|---|
| *G02B 26/08* | (2006.01) |
| *G21K 5/04* | (2006.01) |
| *H01L 31/18* | (2006.01) |
| *H05K 1/03* | (2006.01) |
| *H05K 3/02* | (2006.01) |

(52) U.S. Cl.
CPC .......... *G21K 5/04* (2013.01); *H01L 31/1884* (2013.01); *H05K 3/02* (2013.01); *G06F 2203/04112* (2013.01); *H05K 1/0393* (2013.01); *H05K 3/027* (2013.01); *H05K 2201/0108* (2013.01); *H05K 2201/0145* (2013.01); *H05K 2201/026* (2013.01); *H05K 2203/1142* (2013.01); *Y02E 10/50* (2013.01)

(58) Field of Classification Search
CPC ... G21K 5/04; H01L 31/1884; H01L 31/1888; B41M 5/262; B41M 5/267; H05K 3/02
USPC ...................................................... 359/217.2
See application file for complete search history.

(56) References Cited

U.S. PATENT DOCUMENTS

| | | | |
|---|---|---|---|
| 3,388,461 A | 6/1968 | Lins | |
| 4,713,518 A | 12/1987 | Yamazaki et al. | |
(Continued)

FOREIGN PATENT DOCUMENTS

| | | |
|---|---|---|
| CN | 1926460 | 3/2007 |
| CN | 1966224 | 5/2007 |
(Continued)

OTHER PUBLICATIONS

Official Letter and Search Report from the Taiwan Intellectual Property Office for Application No. 102139285, 20 pages, dated Jun. 13, 2016 (with English translation).
(Continued)

*Primary Examiner* — Euncha Cherry
(74) *Attorney, Agent, or Firm* — Klarquist Sparkman, LLP

(57) ABSTRACT

Disclosed herein are laser scanning systems and methods of their use. In some embodiments, laser scanning systems can be used to ablatively or non-ablatively scan a surface of a material. Some embodiments include methods of scanning a multi-layer structure. Some embodiments include translating a focus-adjust optical system so as to vary laser beam diameter. Some embodiments make use of a 20-bit laser scanning system.

20 Claims, 20 Drawing Sheets

Related U.S. Application Data a continuation-in-part of application No. PCT/US2013/060470, filed on Sep. 18, 2013, application No. 14/323,954, which is a continuation-in-part of application No. PCT/US2014/017841, filed on Feb. 21, 2014, application No. 14/323,954, which is a continuation-in-part of application No. PCT/US2014/017836, filed on Feb. 21, 2014, which is a continuation-in-part of application No. 14/030,799, filed on Sep. 18, 2013, now Pat. No. 9,537,042.

(60) Provisional application No. 61/818,881, filed on May 2, 2013, provisional application No. 61/767,420, filed on Feb. 21, 2013, provisional application No. 61/875,679, filed on Sep. 9, 2013.

(56) References Cited

U.S. PATENT DOCUMENTS

| | | | |
|---|---|---|---|
| 4,863,538 | A | 9/1989 | Deckard |
| 5,008,555 | A | 4/1991 | Mundy |
| 5,252,991 | A | 10/1993 | Storlie et al. |
| 5,509,597 | A | 4/1996 | Laferriere |
| 5,523,543 | A | 6/1996 | Hunter, Jr. et al. |
| 5,932,119 | A | 8/1999 | Kaplan et al. |
| RE37,585 | E | 3/2002 | Mourou et al. |
| 6,362,004 | B1 | 3/2002 | Noblett |
| 6,426,840 | B1 | 7/2002 | Partanen et al. |
| 6,490,376 | B1 | 12/2002 | Au et al. |
| 6,577,314 | B1 | 6/2003 | Yoshida et al. |
| 7,349,123 | B2 | 3/2008 | Clarke et al. |
| 7,781,778 | B2 | 8/2010 | Moon et al. |
| 8,071,912 | B2 | 12/2011 | Costin, Sr. et al. |
| 8,251,475 | B2 | 8/2012 | Murray et al. |
| 8,269,108 | B2 | 9/2012 | Kunishi et al. |
| 8,310,009 | B2 | 11/2012 | Saran et al. |
| 8,414,264 | B2 | 4/2013 | Bolms et al. |
| 8,472,099 | B2 | 6/2013 | Fujino et al. |
| 8,809,734 | B2 | 8/2014 | Cordingley et al. |
| 2003/0213998 | A1 | 11/2003 | Hsu et al. |
| 2004/0112634 | A1 | 6/2004 | Tanaka et al. |
| 2004/0207936 | A1 | 10/2004 | Yamamoto et al. |
| 2005/0168847 | A1 | 8/2005 | Sasaki |
| 2005/0233557 | A1 | 10/2005 | Tanaka et al. |
| 2006/0275705 | A1 | 12/2006 | Dorogy et al. |
| 2008/0246024 | A1 | 10/2008 | Touwslager et al. |
| 2009/0122377 | A1 | 5/2009 | Wagner |
| 2009/0274833 | A1 | 11/2009 | Li |
| 2009/0314752 | A1 | 12/2009 | Manens et al. |
| 2010/0025387 | A1 | 2/2010 | Arai et al. |
| 2010/0225974 | A1* | 9/2010 | Sandstrom ......... G03F 7/70291 358/3.26 |
| 2010/0230665 | A1 | 9/2010 | Verschuren et al. |
| 2011/0080476 | A1 | 4/2011 | Dinauer et al. |
| 2011/0127697 | A1 | 6/2011 | Milne |
| 2011/0278277 | A1 | 11/2011 | Stork Genannt |
| 2011/0279826 | A1 | 11/2011 | Miura et al. |
| 2012/0127097 | A1 | 5/2012 | Gaynor et al. |
| 2012/0145685 | A1 | 6/2012 | Ream et al. |
| 2012/0148823 | A1 | 6/2012 | Chu |
| 2012/0156458 | A1 | 6/2012 | Chu |
| 2012/0295071 | A1 | 11/2012 | Sato |
| 2012/0301733 | A1 | 11/2012 | Eckert et al. |
| 2012/0301737 | A1 | 11/2012 | Labelle et al. |
| 2013/0005139 | A1 | 1/2013 | Krasnov et al. |
| 2013/0022754 | A1 | 1/2013 | Bennett et al. |
| 2013/0023086 | A1 | 1/2013 | Chikama et al. |
| 2013/0027648 | A1 | 1/2013 | Moriwaki |
| 2013/0095260 | A1 | 4/2013 | Bovatsek et al. |
| 2013/0228442 | A1 | 9/2013 | Mohaptatra et al. |
| 2014/0104618 | A1 | 4/2014 | Potsaid et al. |
| 2014/0332254 | A1 | 11/2014 | Pellerite et al. |
| 2014/0333931 | A1 | 11/2014 | Lu et al. |
| 2015/0165556 | A1 | 6/2015 | Jones et al. |
| 2015/0352664 | A1 | 12/2015 | Errico et al. |
| 2016/0158889 | A1 | 6/2016 | Carter et al. |

FOREIGN PATENT DOCUMENTS

| | | |
|---|---|---|
| CN | 101836309 | 10/2007 |
| CN | 101143405 | 3/2008 |
| CN | 101303269 | 11/2008 |
| CN | 101314196 | 12/2008 |
| CN | 102448623 | 3/2009 |
| CN | 101733561 | 6/2010 |
| CN | 201783759 | 4/2011 |
| CN | 102084282 | 6/2011 |
| CN | 102176104 | 9/2011 |
| CN | 102207618 | 10/2011 |
| CN | 102301200 | 12/2011 |
| CN | 102441740 | 5/2012 |
| DE | 20320269 | 4/2004 |
| EP | 2587564 | 5/2013 |
| JP | H 02220314 | 9/1990 |
| JP | 2005316068 | 11/2005 |
| JP | 2006-106227 | 4/2006 |
| JP | 2008-281395 | 11/2008 |
| RU | 2008742 | 2/1994 |
| RU | 2021881 | 10/1994 |
| TW | 553430 | 9/2003 |
| TW | 200633062 | 9/2006 |
| TW | I271904 | 1/2007 |
| TW | 200707466 | 2/2007 |
| TW | 201307949 | 2/2013 |
| WO | WO 95/11100 | 4/1995 |
| WO | WO 95/11101 | 4/1995 |
| WO | WO 2012/102655 | 8/2012 |

OTHER PUBLICATIONS

Official Letter and Search Report from the Taiwan Intellectual Property Office for Application No. 103106020, 21 pages, dated Apr. 20, 2016 (with English translation).

Chung, "Solution-Processed Flexible Transparent Conductors Composed of Silver Nanowire Networks Embedded in Indium Tin Oxide Nanoparticle Matrices," Nano Research, 10 pages (Sep. 24, 2012).

First Office Action from Chinese Application No. 201410455972.X, dated Jan. 26, 2016, 21 pages (with English translation).

Gardner, "Precision Photolithography on Flexible Substrates," http://azorescorp.com/downloads/Articles/AZORESFlexSubstrate.pdf (prior to Jan. 30, 2013).

Product Brochure entitled "3-Axis and High Power Scanning," by Cambridge Technology, 4 pages, downloaded Dec. 21, 2013.

Product Brochure supplement entitled "Theory of Operation," by Cambridge Technology, 2 pages, downloaded Dec. 21, 2013.

Search Report from the Taiwan Intellectual Property Office for related Application No. 102139285, dated Sep. 1, 2015 (w/ English translation).

Website describing 3-Axis Laser Scanning Systems at http://www.camtech.com/index.php?option=com_content&view=article&id=131&Itemid=181, 4 pages, accessed Dec. 31, 2014.

Grigoriyants et al., "Tekhnologicheskie protsessy lazernoy obrabotki," Moscow, izdatelstvo MGTU im. N.E. Baumana, p. 334, lines 10-13 (2006). (No English abstract or translation available).

International Search Report and Written Opinion from International Application No. PCT/US2013/060470, dated Jan. 16, 2014, 8 pages.

International Search Report and Written Opinion from International Application No. PCT/US2014/017836, dated Jun. 10, 2014, 6 pages.

International Search Report and Written Opinion from International Application No. PCT/US2014/017841, dated Jun. 5, 2014, 6 pages.

Official Letter and Search Report from Taiwan Application No. 103130968, dated Dec. 20, 2016, 16 pages (with English translation).

Second Office Action from Chinese Application No. 201410455972.X, dated Nov. 22, 2016, 22 pages (with English translation).

(56) References Cited

OTHER PUBLICATIONS

Official Letter and Search Report from the Taiwan Intellectual Property Office for Taiwan Application No. 102139285, 8 pages, dated Nov. 21, 2016 (with English translation.).
Affine Transformation—from Wolfram MathWorld, http://mathworld.wolfram.com/AffineTransformation.html, downloaded Feb. 21, 2014, 2 pages.
Intellectual Search Report and Written Opinion for International Application No. PCT/US2016/063086, 6 pages, dated Mar. 23, 2017.
International Search Report and Written Opinion for International Application No. PCT/US2017/014182, 9 pages, dated Mar. 31, 2017.
Java—Transform a triangle to another triangle—Stack Overflow, http://stackoverflow.com/questions/1114257/transform-a-triangle-to-another-tirangle?1q=1, downloaded Feb. 21, 2014, 3 pages.
Office Action for related Chinese Application No. 201480022179.9, 5 pages, dated Mar. 30, 2017.
Office Action (with English Translation) for related Korea Application No. 10-2014-0120247, dated Apr. 14, 2017, 11 pages.
First Office Action from Chinese Application No. 201480019324.8 (with English translation) dated Apr. 5, 2017, 20 pages.
Office Action (w/English translation) for related Taiwan Application No. 103130968 dated Jun. 7, 2017, 5 pages.
Search Report from the Taiwan Intellectual Property Office for related Application No. 102139285, 10 pages, dated Sep. 4, 2017 (w/ Eng. trans.).

\* cited by examiner

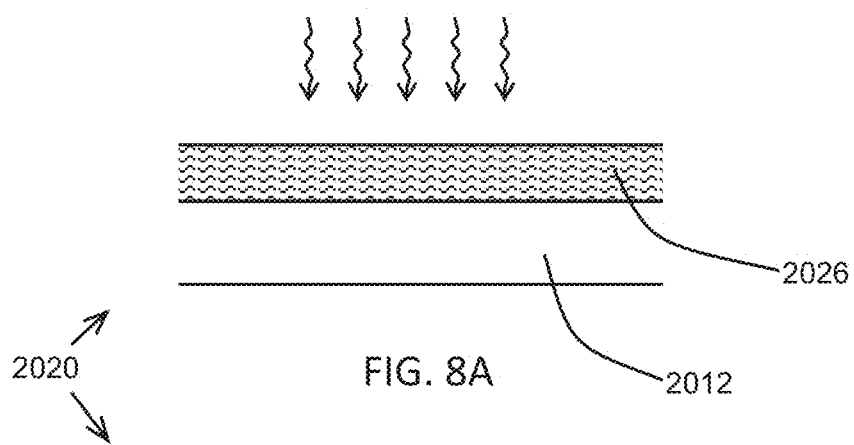
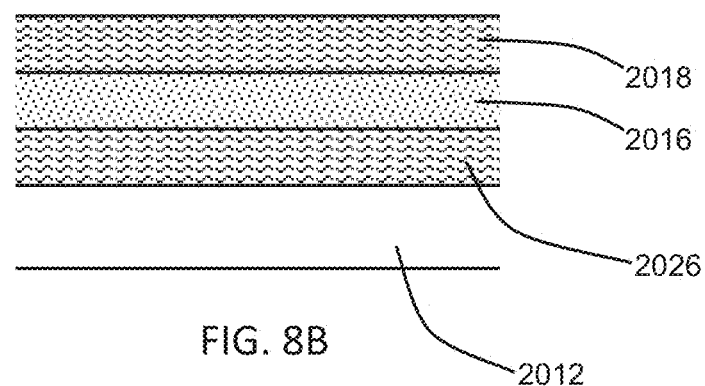
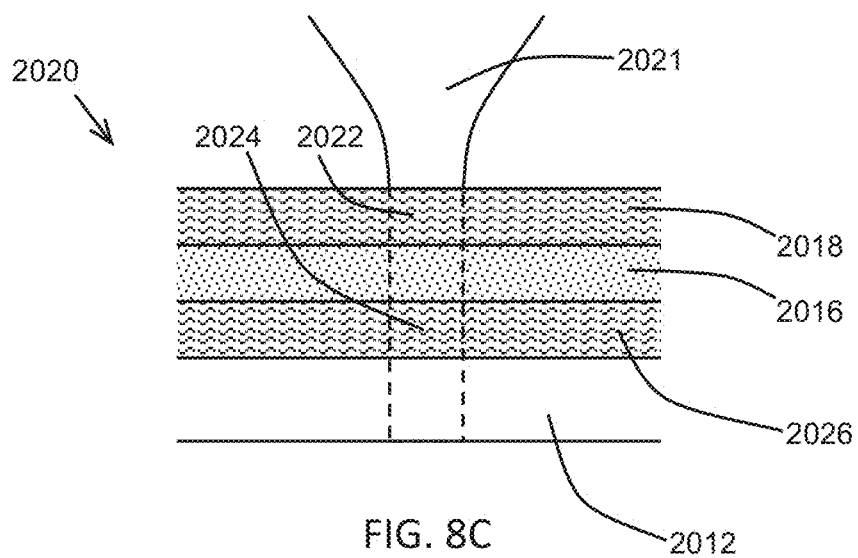

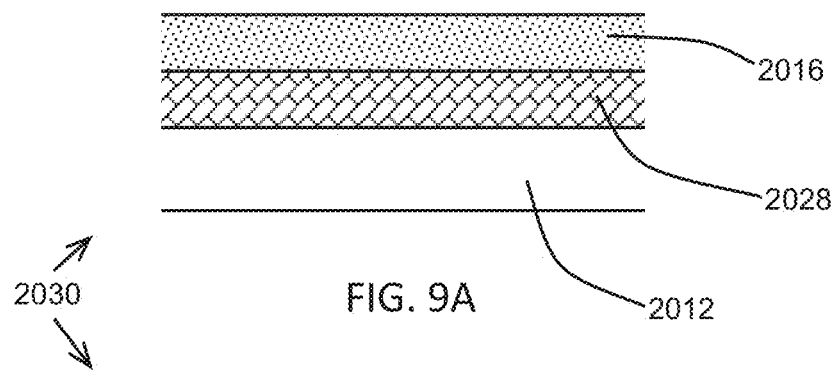
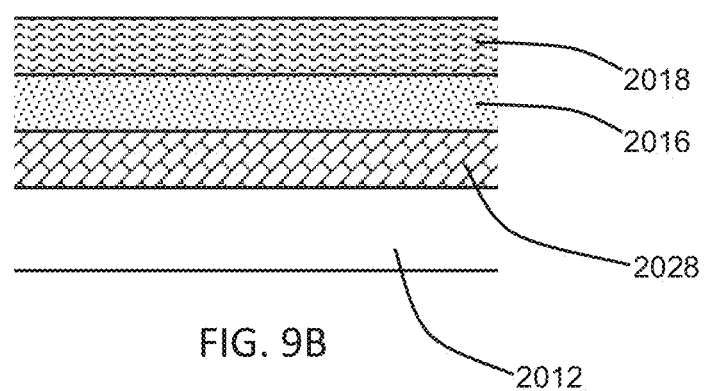
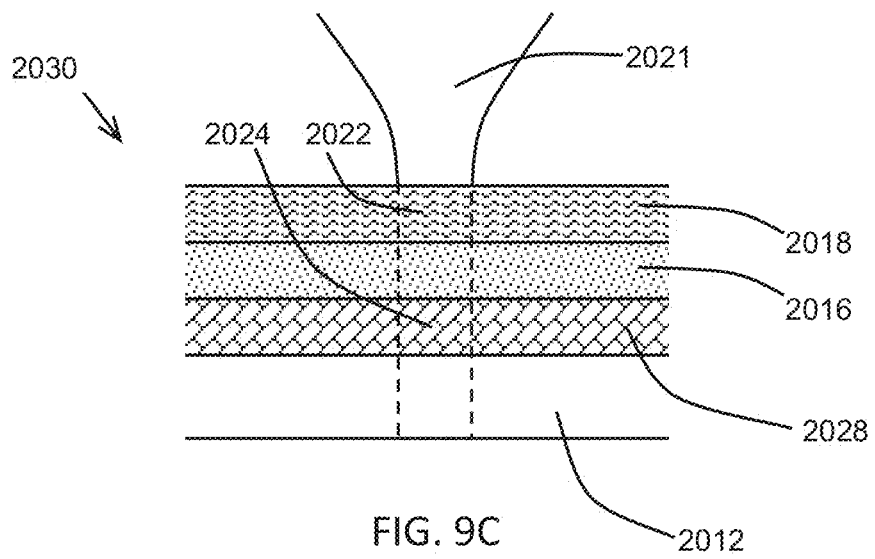

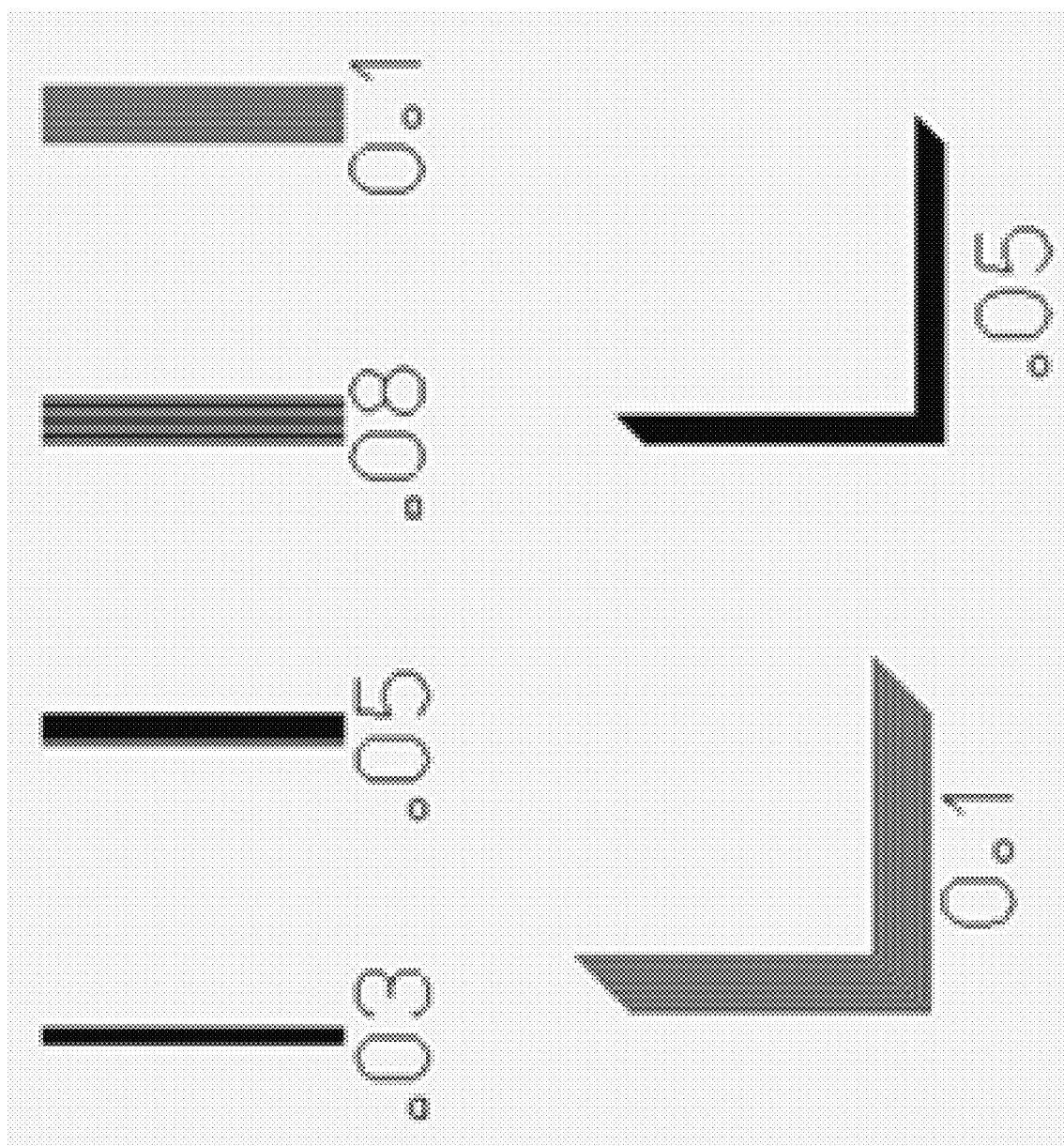

OPTIMIZATION OF HIGH RESOLUTION DIGITALLY ENCODED LASER SCANNERS FOR FINE FEATURE MARKING

CROSS REFERENCE TO RELATED APPLICATIONS

This application is a continuation-in-part of U.S. patent application Ser. No. 14/030,799, and PCT Application No. PCT/US2013/060470, both filed Sep. 18, 2013, both of which claim priority to U.S. Provisional Patent Application Nos. 61/818,881, filed May 2, 2013, and 61/767,420, filed Feb. 21, 2013.

This application is a continuation-in-part of PCT Application No. PCT/US2014/017841, filed Feb. 21, 2014, which claims priority to U.S. Provisional Patent Application Nos. 61/818,881, filed May 2, 2013, 61/767,420, filed Feb. 21, 2013, and 61/875,679, filed Sep. 9, 2013.

This application is a continuation-in-part of PCT Application No. PCT/US2014/017836, filed Feb. 21, 2014, which claims the benefit of U.S. patent application Ser. No. 14/030,799, filed Sep. 18, 2013, and U.S. Provisional Patent Applications Nos. 61/818,881, filed May 2, 2013, and 61/767,420, filed Feb. 21, 2013.

This application claims the benefit of U.S. Provisional Patent Application No. 61/875,679, filed Sep. 9, 2013.

The prior applications PCT/US2013/060470, PCT/US2014/017836, PCT/US2014/017841, Ser. No. 14/030,799, 61/818,881, 61/767,420, and 61/875,679, are hereby incorporated herein by reference in their entireties.

FIELD

The present disclosure relates generally to laser patterning, and more particularly to optimization of high resolution digitally encoded laser scanners for fine feature marking.

BACKGROUND

Strong demand for smaller and more portable computing devices has led to substantial innovation in many corresponding areas, including touch screens for smartphones and tablet computers. However, there remains much room for improvement in the area of touch sensor patterning and printed electronics. Existing technologies, including photolithography, screen printing, and laser processing, suffer from various drawbacks due in part to the number of processing steps required and the costs and time consumed in switching between various processing steps. In addition to costs associated with various processing steps, photolithographic and screen printing techniques include numerous drawbacks, including increased cost associated with expensive consumables and toxic waste. Conventional laser processing techniques also suffer from numerous drawbacks. It is unfortunate that the current state of the art has yet to produce more efficient methods and systems for processing printed electronics and touch sensors. Accordingly, there remains a need for improved methods and systems for processing these devices without the attendant drawbacks.

SUMMARY

The present disclosure is directed to satisfying the aforementioned need by providing an innovation in the form of laser processes which change the conductivity of a surface of a substrate without ablating the material thereof. Thus, according to one aspect of the present disclosure, a method is provided for processing a transparent substrate, the method including the steps of generating at least one laser pulse having laser parameters selected for non-ablatively changing a conductive layer disposed on the transparent substrate into a non-conductive feature, and directing the pulse to the conductive layer.

In some embodiments, the laser parameters include a pulse length of less than about 200 ps and a pulse fluence of less than about 1.5 J/cm². In some embodiments, a spot size of the pulse is varied within a range of 5 to 100 μm by varying the position of the substrate in relation to the incident pulse. In some embodiments, the transparent substrate includes a protective film disposed on a surface of the substrate opposite from the conductive layer, and which protective film is not removed during the non-ablative processing of the conductive layer. In some embodiments, the transparent substrate is made of a flexible polyethylene terephthalate material. In some embodiments, to an unaided eye of an observer the non-conductive feature is visibly indistinguishable or has very low visibility as compared to an adjacent unprocessed conductive layer. In some embodiments, the pulse is directed through the transparent substrate to the conductive layer. In some embodiments, the conductive layer includes silver nanowires. In some embodiments, the surface roughness of the conductive layer is substantially unchanged after processing with the laser pulse. In some embodiments, the conductive layer becomes non-conductive in the processed area through a selective oxidation mechanism.

In another aspect of the present disclosure, a method is provided for changing the sheet resistance of a conductive matrix of silver nanowires on a flexible transparent substrate, the method including generating at least one pulse with laser parameters selected in a range for increasing the sheet resistance of the conductive matrix without ablating the silver nanowires, and directing the pulse to the conductive matrix to increase the sheet resistance. In some embodiments, the flexible transparent substrate includes a protective film disposed on a surface of the substrate opposite from the conductive matrix of silver nanowires, and which protective film is not removed during the non-ablative processing of the conductive matrix by the laser pulse. In some embodiments, to an unaided eye of an observer an area processed by a plurality of the laser pulses is visibly indistinguishable or has very low visibility as compared to an adjacent unprocessed area.

In a further aspect of the present disclosure, a method is provided for processing a transparent substrate with a pulsed laser beam, the substrate being characterized by having a conductive material disposed on a selected surface thereof, the conductive material capable of experiencing non-ablative change into non-conductive material with a pulsed laser beam having selected parameters, the method including the steps of generating at least one laser pulse with the selected parameters, and directing the pulse to the conductive material on the substrate to produce the change into non-conductive material.

In some embodiments, the transparent substrate includes a protective film disposed on a surface of the substrate opposite from the conductive material, and which protective film is not removed during the non-ablative processing of the conductive material. In some embodiments, to an unaided eye of an observer the non-conductive material is visibly indistinguishable or has very low visibility as compared to unprocessed conductive material.

In a further aspect of the present disclosure, a method is provided for processing a conductive material layer of a flexible transparent substrate with a pulsed laser beam, the conductive material layer characterized in that exposure to a laser pulse having selected laser pulse parameters causes the conductive material to become non-conductive material without ablatively removing the material layer, the method including the steps of generating at least one laser pulse which has the selected laser pulse parameters, and directing the pulse to the conductive material layer of the substrate. In some embodiments the conductive material layer includes silver nanowires.

In another aspect of the present disclosure target surfaces can be processed with laser pulses such that processed areas are not visually distinguishable from adjacent unprocessed areas except under substantial magnification. In another aspect of the present disclosure, a protective layer typically disposed on a surface of the substrate to be processed and removed during processing is instead left intact and not removed from the substrate during processing.

According to one aspect of the present disclosure, a method of laser patterning a multi-layer structure, the multi-layer structure including a substrate, a first layer disposed on the substrate, a second layer disposed on the first layer, and a third layer disposed on the second layer, includes generating at least one laser pulse having laser parameters selected for non-ablatively changing the conductivity of a selected portion of the third layer such that the selected portion becomes non-conductive, and directing the pulse to the multi-layer structure, wherein the conductivity of the first layer is not substantially changed by the pulse.

In some embodiments, the first layer and third layer include silver nanowires. In some embodiments, the first layer includes ITO. In some embodiments, the second layer is a photoresist with insulation properties. In some embodiments, the second layer is configured to protect the first layer from conductivity altering characteristics of said pulse. In some embodiments, the second layer is configured to scatter or absorb energy from said pulse. In some embodiments, the first layer has a higher conductivity alteration threshold than the third layer. In some embodiments, the first layer has been heat treated so as to increase the conductivity altering threshold thereof.

In another aspect of the disclosure a method of forming a multi-layer stack-up structure includes providing a substrate, depositing a first layer on the substrate, the first layer being conductive, laser patterning the first layer such that selected portions of the first layer become non-conductive, depositing a second layer on the first layer, the second layer being insulating, depositing a third layer on the second layer, the third layer being conductive, and non-ablatively laser patterning the third layer such that selected portions of the third layer become non-conductive without substantially changing the conductivity of the first layer.

In some embodiments, the first and third layers include silver nanowires. In some embodiments, the first layer includes ITO. In some embodiments, the second layer is photoresist with insulation properties. In some embodiments, the second layer is configured to protect the first layer from changing conductivity during the non-ablative laser patterning of the third layer. In some embodiments, the second layer is configured to scatter or absorb energy during the non-ablative laser patterning of the third layer. In some embodiments, the first layer has a higher conductivity alteration threshold than the third layer. In some embodiments, the method further comprises the step of heat treating the first layer after the first layer has been laser patterned. In some embodiments, the laser patterning of the first layer is non-ablative.

In some embodiments, an optical processing system comprises an objective lens situated to direct a processing optical beam to a target surface and a scanning system situated to scan the processing optical beam across the target surface. A focus-adjust optical system includes a focus-adjust optical element and a focus actuator, the focus-adjust optical element situated to direct the optical beam to the objective lens. The focus actuator is coupled to the focus-adjust optical element so as to translate the focus-adjust optical element along an axis of the objective lens so as to maintain a focus of the processing beam as the processing beam is scanned across the target surface. A beam diameter actuator is situated to translate the focus-adjust optical system so as to define a processing beam diameter at the target surface. In some examples, a controller is coupled to the focus actuator so as to maintain the focus of the processing beam during scanning across the target surface. In other examples, a substrate stage includes a stage actuator situated to position the target surface along the axis of the objective lens. In further examples, the controller is coupled to the beam diameter actuator and the stage actuator and the controller translates the focus adjust optical system and the substrate stage based on a selected beam diameter. In a particular example, the beam diameter actuator produces stepwise translations of the focus adjust optical system, and is translatable to at least two locations along the axis of the objective lens, the at least two locations associated with corresponding focused beam diameters having a larger to smaller diameter ratio of at least 2:1, 3:1, 4:1, 5:1, 7.5:1, or 10:1. Typically, the beam diameter actuator is situated to translate the focus-adjust optical system so as to define at least two processing beam diameters corresponding to ablative processing and non-ablative processing of silver paste conductive borders, and silver nanowire or indium tin oxide conductive layers, or vice versa. In some examples, a laser produces the processing beam, and a laser controller selects optical beam powers based on the processing beam diameters. In some examples, the focus actuator is coupled to the focus-adjust optical element so as to translate the focus-adjust optical element along the axis of the objective lens so as to compensate for field curvature of the objective lens.

Methods include translating a focus adjust optical element along an axis of an objective lens while processing a substrate with an optical beam from the objective lens so as to maintain a processing beam focus at a target. A processing beam diameter is selected by translating the focus adjust optical element along the axis of the objective lens. In some examples, processing beam diameter is selected from among at least two predetermined values, wherein the predetermined values have a larger to smaller diameter ratio of at least 1.5:1. In other examples, the target is a composite having a conductive layer and a conductive border, wherein the at least two predetermined values include first and second processing beam diameters selected for processing the conductive layer and the conductive border, respectively. In additional examples, the first and second processing beam diameters are selected so that the conductive layer is processed non-ablatively and the conductive border is processed ablatively or vice versa. In typical applications, the processing beam diameters are selected to process one or more of a silver nanowire or indium tin oxide conductive layer and a silver paste conductive border. In some embodiments, the target is translated along the axis of the objective lens based on the selected processing beam diameter. In a representative example, at least two processing beam diameters are selected for processing a conductive layer and a conductive border of a composite substrate, wherein the processing beam diameters are selected from among at least two predetermined values, wherein the predetermined values have a larger to smaller diameter ratio of at least 2:1. In some examples, the first and second processing beam diameters are selected so that the conductive layer is processed non-ablatively and the conductive border is processed ablatively or vice versa. In some examples, a method further comprises selecting first and second optical beam powers corresponding to the first and second processing beam diameters.

In some embodiments, a method comprises receiving a pattern description stored in at least one computer readable storage medium, the pattern description comprising a definition of at least one pattern feature associated with a scan vector, and directing a laser beam over a fixed scan area based on the pattern description, wherein the laser beam is directed over the scan area with a transverse displacement resolution that is less than 1/20 of a laser beam diameter.

In some embodiments, a method comprises selecting a laser beam diameter, situating a substrate to be scanned at a scan plane associated with the selected laser beam diameter, and exposing the substrate to a laser beam with the selected laser beam diameter by scanning the laser beam with respect to the substrate, wherein the laser beam is scanned with angular scan increments corresponding to less than 1/10 of the laser beam diameter at the scan plane.

In some embodiments, an apparatus comprises a laser configured to produce a processing beam, an optical system, and a scan controller configured to receive a scan pattern defined as a plurality of scan vectors and configured to control the optical system to direct the processing beam to a scan area with a predetermined beam diameter. In some cases, the scan controller is configured to control the optical system to scan the processing beam with respect to the scan area so as to produce an exposed scan vector such that a transverse offset between the exposed scan vector and an intended scan vector is less than 1/10 of the predetermined beam diameter.

The foregoing and other objects, features, and advantages of the disclosure will become more apparent from the following detailed description, which proceeds with reference to the accompanying figures.

BRIEF DESCRIPTION OF THE DRAWINGS

FIGS. 8A-8C show cross-sections of an exemplary stack-up structure at various steps in fabrication, in accordance with another aspect of the present disclosure.

FIGS. 9A-9C show cross-sections of an exemplary stack-up structure at various steps in fabrication, in accordance with another aspect of the present disclosure.

FIG. 21 illustrates an input pattern for a laser scanning system.

DETAILED DESCRIPTION

I. General Considerations

Figure 1:
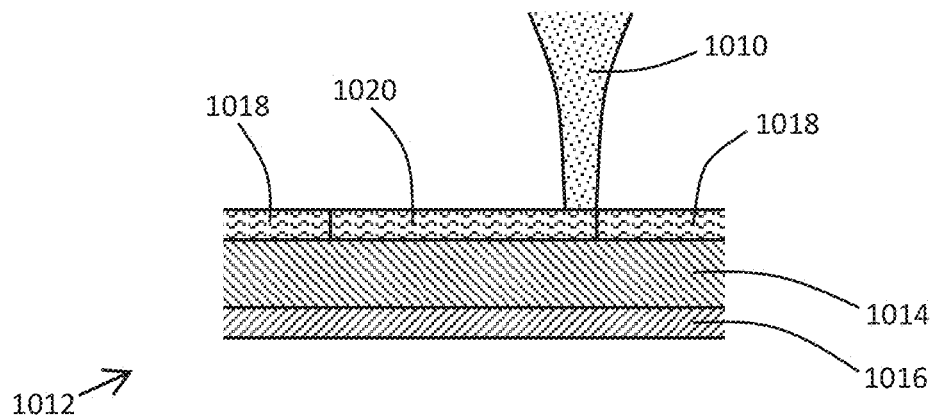
FIG. 1 is a cross-sectional view of laser beam processing a substrate in accordance with an aspect of the present disclosure.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

For convenient description, terms such as "top," "upper," "lower," "bottom" and the like are used to describe certain features of the disclosed embodiments. Such terms are not intended to refer to a particular orientation, but are instead used to indicate relative positions.

As used herein, laser beam diameters are generally based on $1/e^2$ intensities for a lowest order $TEM_{00}$ mode or similar power distribution. The terms "axis" or "optical axis" refer to axes coupling optical elements. Such axes need not be a single straight line segment, but can include a plurality of line segments corresponding to bends and folds produced with mirrors, prisms, or other optical elements. As used herein, a lens refers to single lens element or multi-element (compound) lenses.

II. Non-Ablative Laser Patterning

Flexible substrates have the advantage of potentially being inexpensive to manufacture, though such efficiencies have not been realized under conventional processes. Accordingly, various examples described herein are directed to the manufacture of processed composite films for different applications, such as transparent conductors for touch-sensitive displays. For example, steps for processing the flexible composite films can be configured so that touch sensitive regions are formed in the flexible composite film such that the touch sensitive regions become suitable for use in various display devices. Other suitable applications for processed substrates can include display devices more generally, as well as LED phosphor enhancements, other commercial and consumer lighting applications, wearable electronics, and photovoltaic cells. However, flexible substrates are particularly well-suited for mobile consumer displays, where thinner, durable, and flexible formats are highly desirable. Moreover, by utilizing the advances described herein, flexible film laser patterning can be achieved with an intact protective layer, enabling true roll to roll processing. In some examples, the substrate can be rigid as well.

Referring now to FIG. 1, a cross-sectional view is shown of a pulsed laser beam 1010 with selected laser pulse parameters processing a target 1012 in accordance with an aspect of the present disclosure. As shown the target 1012 includes a transparent substrate 1014 having a protective layer 1016 disposed on one side and thin layer 1018 of conductive material disposed on the other side opposite from the one side. In many examples, the substrate 1014 has a constant or fixed thickness, such as in the range between 50 μm and 200 μm, usually depending upon the application for the substrate and material or materials used. In further examples, additional layers may be disposed in relation to the substrate 1014 and associated protective and thin layers 1016, 1018, such as the formation a composite substrate or a substrate with one or more other materials or layers deposited thereon.

In some examples the layer 1018 of conductive material includes a random arrangement of silver nanowires. The silver nanowires of the thin layer 1018 are typically secured to the substrate 1014 in a polymer matrix, such as an organic overcoat. The laser beam 1010 delivers laser pulses to the thin layer 1018 and creates a processed portion 1020 where the conductivity of the material of layer 1018 changes substantially. Herein, the terms "conductive" and "non-conductive" have meanings attributed to them that are generally understood in the art of printed electronics, touch sensor patterning, or optoelectronicas, as set forth in greater detail below.

Figure 2:
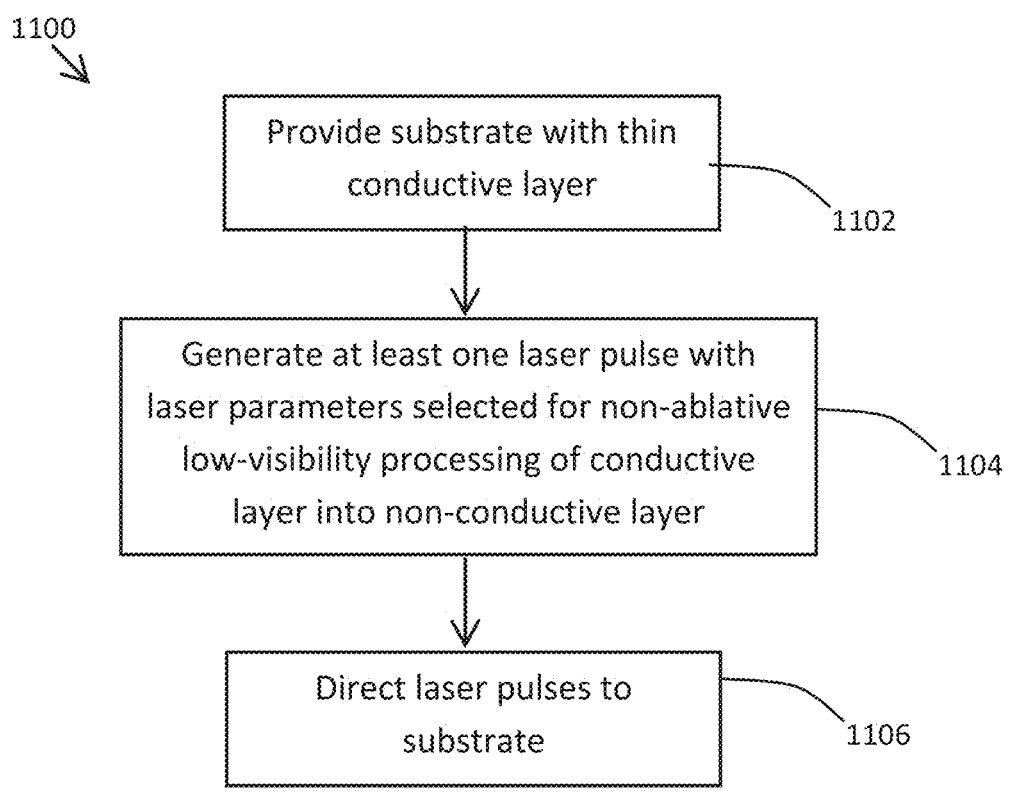
FIG. 2 is a flowchart block diagram of a method in accordance with an aspect of the present disclosure.

FIG. 2 shows a flowchart block diagram of an exemplary method 1100 in accordance with an aspect of the present disclosure. In a first step 1102, a substrate is provided with a thin conductive layer disposed thereon. The substrate is preferably transparent and flexible, but other substrates can be processed in accordance herein without departing from the scope of the present disclosure. In accordance with another aspect of the present disclosure, a protective layer or film can be disposed on another surface of the substrate, for example, opposite from the conductive layer and the substrate can be processed without removing the protective layer or film. In a second step 1104, at least one laser pulse is generated with laser pulse parameters selected for achieving non-ablative processing of the thin conductive layer on the substrate such that the processed portion of the thin conductive layer becomes non-conductive, and such that the processed portion is also low visibility. In a third step 1106, the at least one laser pulse is directed to the substrate. The processed substrate has a different conductivity than the unprocessed substrate such that particular sensing regions and electrical pathways may be formed on the substrate. By carefully selecting the characteristics of the laser pulse, including pulse parameters such as pulse length, pulse fluence, pulse energy, spot size, pulse repetition rate, and scan speed, the substrate may be processed such that electrical characteristics thereof are altered in a predetermined way while the substrate and associated protective and conductive layers are not substantially damaged or structurally altered through an ablative process. Accordingly, a protective layer (for example, the protective layer 1016) need not be removed during processing of the substrate in examples utilizing such a layer.

While the beam 1010 in FIG. 1 is generally shown being brought to a focus thereof, other beam geometrical configurations and intensity distributions are possible, including an unfocused beam, line beams, square or rectangular beams, as well as beams with uniform, substantially uniform or pre-selected intensity profiles across one or more transverse axes. In some examples, the beam delivery system providing the beam 1010 is also configured to translate the beam 1010 in relation to the target 1012 so that the beam can form lines, areas, and other geometrical features thereon. In other examples, the target 1012 can be translated to form geometrical features while the beam delivery system and beam 1010 remain fixed in one or more axes. In still other examples, both the target 1012 and the beam 1010 can be translated. Moreover, in some examples, the beam 1010 impinges the target 1012 from the opposite direction such that the beam 1010 propagates through the protective layer 1016 (if present) and substrate 1014 to cause non-ablative effects to the conductive layer 1018.

As used herein, ablative processing is understood to mean substantial removal of material from a target caused by an incident optical beam by vaporization, photochemical alteration, or otherwise. Similarly, non-ablative processing is understood to mean that the structural features of the existing target surface topology remain intact after processing, even if electrical or other properties of the target are changed. In some examples, a non-ablatively processed surface can be visually indistinguishable from an adjacent unprocessed area. In some examples, non-ablative processing of silver nanowires does not remove or substantially remove the silver nanowires. An overcoat covering the silver nanowires can be removed from the silver nanowires through laser processing without the process being considered ablative with respect to the silver nanowires.

Figure 3:
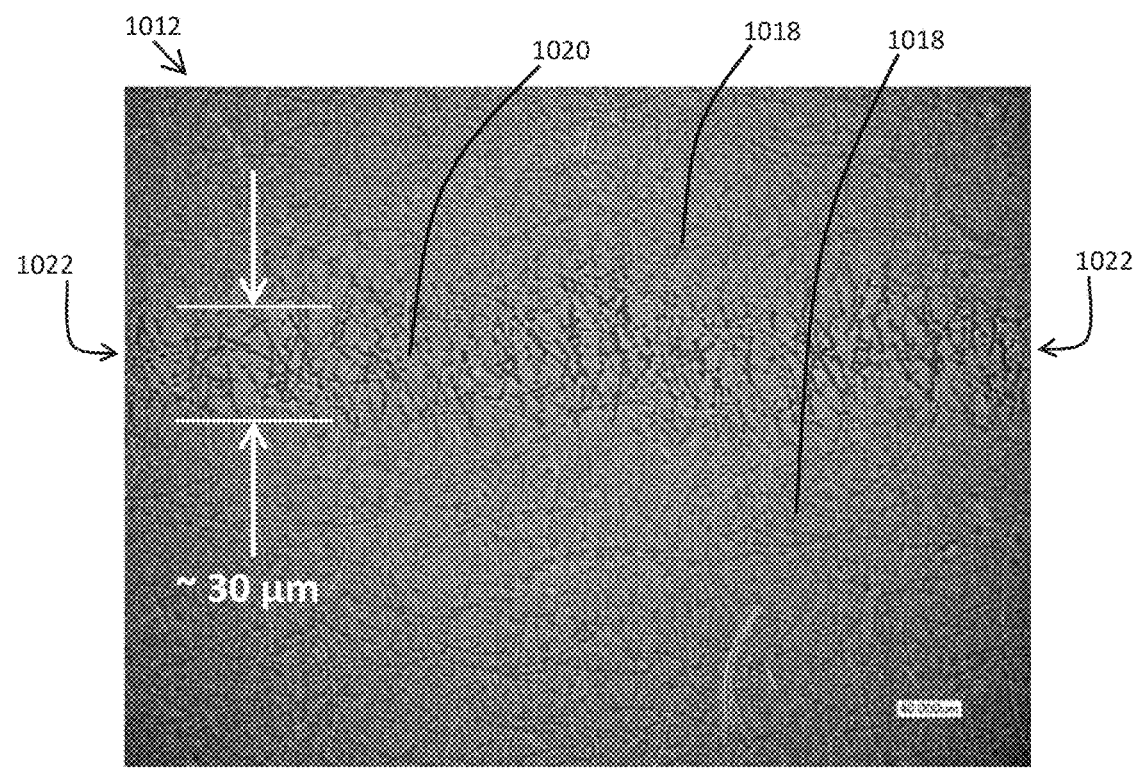
FIG. 3 is a top view image of a laser beam patterned substrate in accordance with an aspect of the present disclosure.

While the laser pulses of the laser beam 1010 cause the processed portion 1020 to become non-conductive, the visible characteristics of the processed portion 1020 remain substantially unchanged. Thus, the distinction between processed and unprocessed portions 1020, 1018 is unnoticeable without the aid of an image enhancement mechanism, such as a microscope, including across multiple viewing angles. Referring to FIG. 3, a microscope image is shown, magnified to 1500× under monochromatic illumination, of a top view of a substrate (such as the substrate 1014) processed in accordance with a representative disclosed method. A horizontal stripe 1022 of processed silver nanowires, which is barely noticeable to an unaided eye even under substantial magnification, is shown that is approximately 30 µm wide, as indicated in FIG. 3. The laser pulse parameters used to provide superior non-ablative results shown in the stripe 1022 include a pulse length of about 50 ps, a pulse fluence of about 0.17 J/cm$^2$, a spot size of about 40 µm 1/e$^2$, a scan rate of about 1 m/s with a pulse-to-pulse overlap of greater than 90%, a total pulse energy of about 12 µJ, and a pulse repetition rate of about 100 kHz.

The aforementioned laser pulse parameter values are merely examples, and other parameters may be selected and optimized for different targets and systems. Additionally, parameter values can be scaled for a variety of processing speeds, provided pulse overlap and pulse energy are maintained in parameter ranges suitable for producing non-ablative non-conductive effects. Thus, pulse repetition rates can be increased to 1 MHz, 10 s of MHz, or more to increase processing speeds provided the requisite laser and beam delivery architectures are configured accordingly. Pulse length can be selected to be shorter or longer and other parameters, such as pulse fluence, can be adjusted to ensure that target is processed non-ablatively into a non-conductive feature. For example, possible pulse lengths include less than about 1 ps, 100 ps, 200 ps, 500 ps, 800 ps, or 1 ns. Other parameters can similarly be varied and optimized accordingly.

After formation, the two portions of the target 1012 above and below the stripe 1022 become electrically isolated from each other due to the change in sheet resistance imparted to the processed area 1020 by the pulses from the laser beam 1010, effectively forming a barrier to conductive flow of electricity. As material specifications change, other parameters can be carefully selected using heuristic or other optimization approaches to achieve the non-ablative conductivity-altering aspects of the processes of the present disclosure while maintaining ultra-low visibility of the processed area as compared to unprocessed areas. The laser beam 1010 can also be modified to have a shape other than Gaussian, such as flat-top, super-Gaussian, etc. Laser systems capable of operating the laser parameter regime of the present disclosure generally include pulsed fiber lasers, pulsed fiber amplifiers, and diode pumped solid-state lasers.

Accordingly, shapes and patterns can be formed on the substrate with the methods disclosed herein so as to achieve electrical isolation from one unprocessed area to the next. In addition to not requiring a mask, photoresists, etch baths, replacing or providing additional protective films, the use of a laser or a scanned laser provides a highly configurable process, allowing for sheet-to-sheet, roll-to-sheet, roll-to-roll (R2R), or roll to finished sensor manufacturing. Scanned lasers can be programmed with an image file to have the process tailored easily for or between various pattern geometries and substrates. Moreover, by utilizing the ultra-low visibility process aspects described herein, even more reductions in cycle time can be achieved over conventional laser or chemical processes. For example, in a conventional laser process, in order to reduce the visibility of ablatively processed areas, additional areas must be unnecessarily processed in order to provide a uniform pattern effect that effectively decreases the overall visibility of the ablative marks to the unaided eye of a user. Because the processing aspects of the present disclosure result in ultra-low visibility marks to begin with, the additional process time associated with filling in areas to decrease visibility is no longer necessary, resulting in a quicker and hence more cost effective process.

The transparent substrate 1014 can be composed of a variety of different materials, including glass, plastic, or metal. Typical substrates tend to be made of polyethylene terephthalate (PET) because of its low cost and advantageous features, including transparency, flexibility, resilience, ease of manufacture, etc. PET substrates can be manufactured using one or more ways known to those with skill in the art of transparent conductive film processing, and which in some examples can be provided in a roll suitable for roll-to-roll processing. A non-exhaustive list of other possible substrate materials includes glass, polyethylene naphthalate, polyurethane, and various metals. The substrate 1014 shown in FIG. 3 has a thickness of about 0.13 mm and is made of polyethylene terephthalate. In this thickness range, PET along with other suitable materials are flexible and can be stored, transported, or configured for processing in a roll of predetermined width. The substrate 1014 is typically transparent for visual display applications such that when the substrate 1014 is later applied to a display device (not shown), light from the display device may propagate through the substrate 1014 towards a user of the device.

In typical examples of flexible transparent conductive films, rough stock is provided in a roll or in a flat sheet configuration for laser pattern processing of the transparent conductive film so that the rough stock becomes processed stock suitable for use in various applications, such as optoelectronic devices. In some examples, transparent conductive film material includes silver nanowires (also referred to as SNW or AgNW) deposited to a predetermined thickness or conductivity, both of which are typically set by increasing or decreasing the density of the silver nanowires in the film production phase. In other examples, transparent conductive film can include other materials or with multiple layers. Transparent conductive films can find end use on rigid surfaces, for example on rigid glass or composite screens. Silver nanowires are well-suited for flexible substrates, as material properties thereof, such as conductivity and structural integrity, are more consistent under bending loads of various types (e.g., fixedly curved, cyclically deformed, or pliable).

The protective layer 1016 can also be made of different materials suitable for providing protection from damage due to particulate matter, scuffs, and scratches. The thickness of the protective layer 1016 is typically selected to be suitable for providing protection to the underlying substrate 1014. One suitable thickness is approximately 0.04 mm, however other thicknesses may be used. Since aspects of the present disclosure can eliminate the need for removing, reapplying, or replacing the protective layer 1016 during manufacture, protective layers 1016 comprising various materials may be possible. Protective films 1016 made from polyethylene or polyethylene terephthalate are suitable for providing the requisite protection of the surface of the substrate 1014. The requirements in conventional processes that protective layers such as the protective layer 1016 must be removed before and reattached or reapplied after processing the substrate 1014 to avoid damage to the protective layer resulting from intense heat imparted by the laser during processing leads to substantial additional processing time and cost. As disclosed herein, a substrate 1014 can be processed without removal and reattachment or reapplication of the protective layer 1016, leading to the potential for revolutionary cost reduction in processing of transparent substrates, including flexible transparent substrates.

Figure 4:
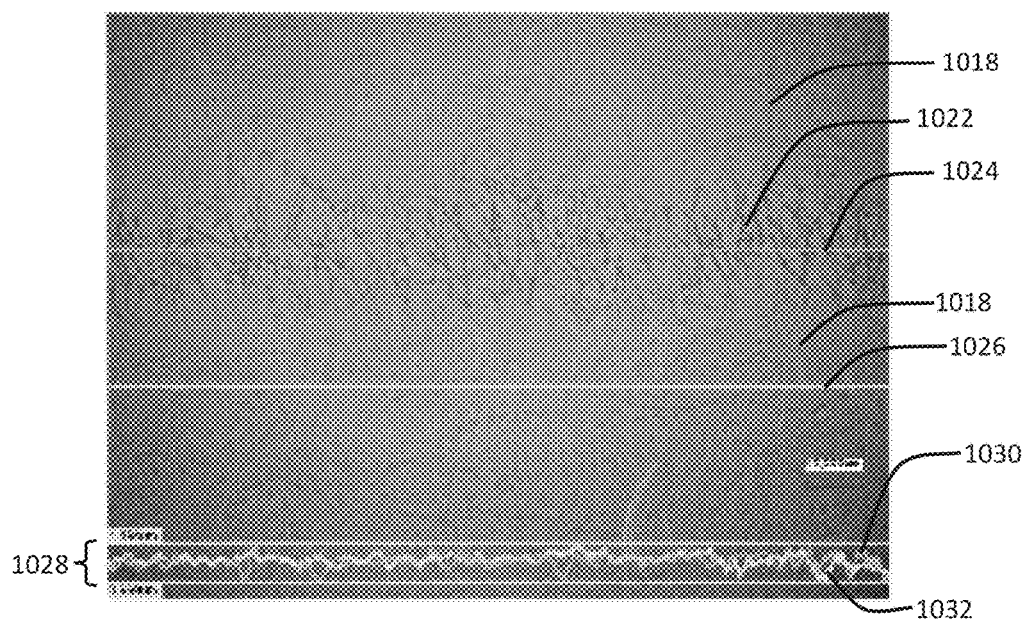
FIG. 4 is an image with overlaid profilometer data of unprocessed and processed areas in accordance with an aspect of the present disclosure.

FIG. 4 is a similar image of a top view of a target substrate 1014 as shown in FIG. 3, with additional surface roughness data superimposed thereon. A first horizontal line 1024 extends approximately along a middle of the processed stripe 1022. About 30 μm adjacent to first horizontal line 1024, a second horizontal line 1026 extends parallel therewith along an unprocessed area 1018. An area 1028 on the bottom of the image includes the transverse depth profiles 1030, 1032 along the respective parallel lines 1024, 1026. The depth profiles are overlaid on one another and show minimal variation with respect to each other in a common range of approximately 0.2 μm of depth, further demonstrating the non-ablative effects associated with processes in accordance with aspects of the present disclosure. Other surfaces may have a larger range of depth variation depending on the quality of the substrate and conductive surface layer, however the variation between processed and unprocessed areas is minimal under the non-ablative processes herein.

Figure 5A:
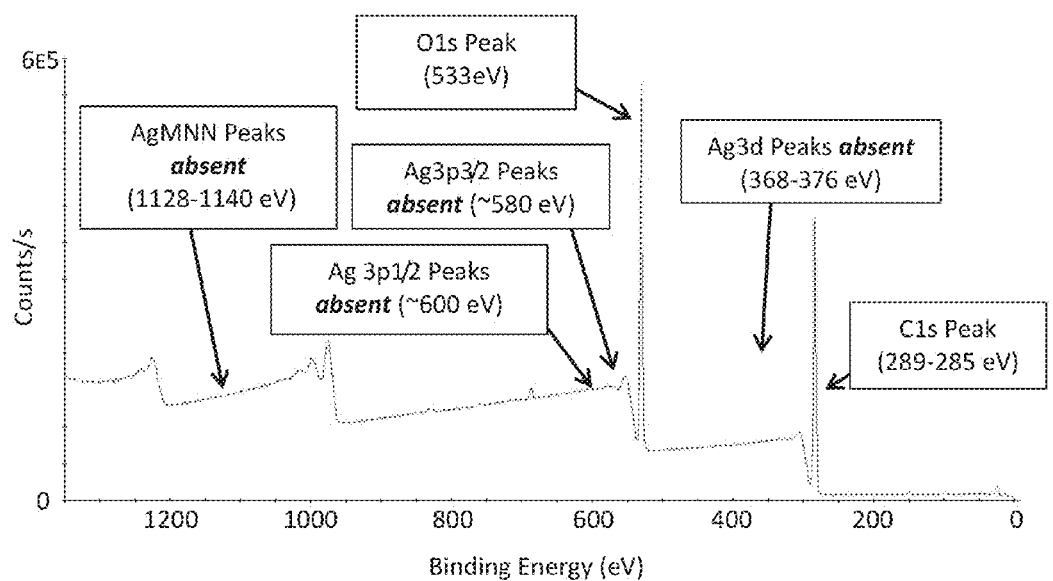
FIGS. 5A and 5B are XPS plots of unprocessed and processed areas, respectively, in accordance with an aspect of the present disclosure.
Figure 5B:
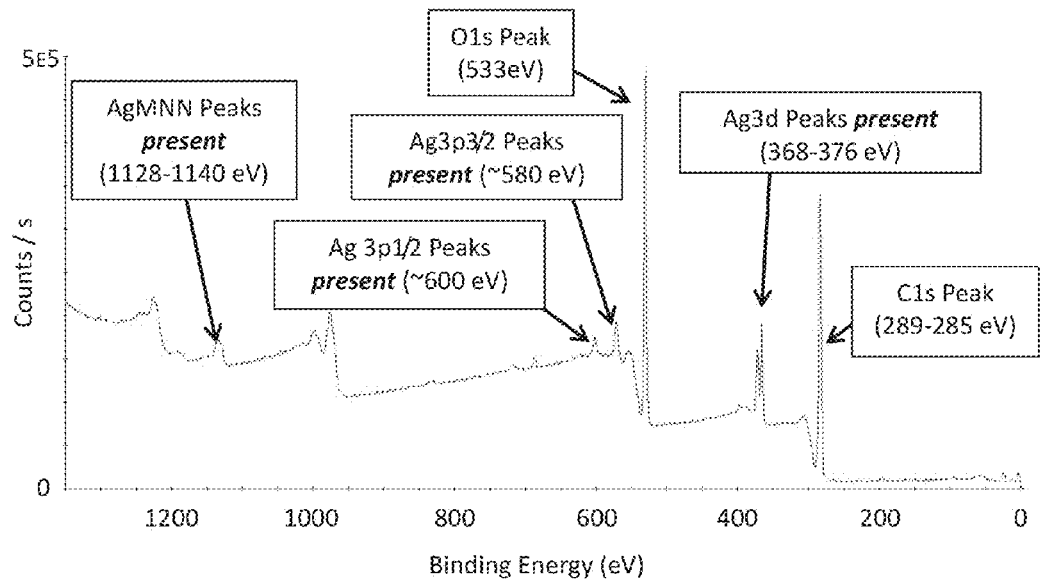
Figure 6:
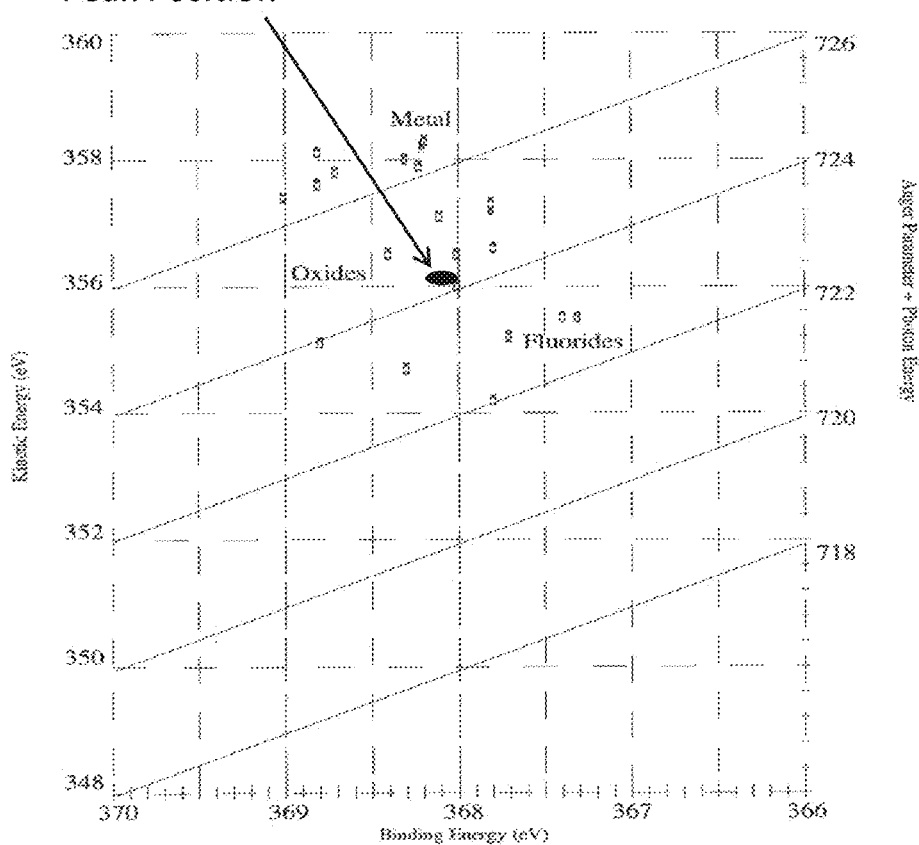
FIG. 6 is an XPS plot of selected species from the plot in of FIG. 5B.

FIGS. 5A and 5B show x-ray photoelectron spectroscopy (XPS) results for unprocessed (FIG. 5A) and processed (FIG. 5B) areas of a substrate 1014, indicating counts per second with respect to binding energy. The XPS generally assist in explaining the elemental content of targeted surfaces and resulting material changes that may occur from various external inputs. The results shown for unprocessed and processed areas are substantially the same across a range of binding energies, with some particular exceptions. Binding energy peaks for AgMNN, Ag 3p3/2, Ag 3p1/2, and Ag 3d, appear in processed areas 1020, generally indicating the presence of oxidized silver. For example, referring to FIG. 6, a plot of binding energy with respect to kinetic and photon energies centered around 368 eV and generally indicates oxide formation in the processed area. Also, comparison of various carbon species, chlorine, fluorine, oxygen, and silicon signal data suggests that the polymer matrix in which the silver nanowires are embedded is present before and after processing by the laser pulses. Thus, it is likely that organic overcoat is selectively removed from the silver nanowires, allowing the nanowires to become oxidized and exhibit a non-conductive characteristic, while the remainder of the overcoat remains substantially intact. In general, silver nanowires can exhibit attributes superior to more conventional transparent conductive films like Indium Tin Oxide (ITO). The transparent conductive layer 1018 is typically on the order of a few tens of nanometers thick. Silver nanowires tend to be approximately 10 μm long and in the range of several to several tens of nanometers in diameter, though other dimensions may be possible.

Laser parameters suitable for non-ablative laser processing in accordance with the methods of the present disclosure can be selected based in part on the relevant properties of the materials selected to be processed. For example, varying thickness of the underlying substrate, the thin conductive layer, etc., can affect how laser pulse heat may be distributed or result in other time-dependent effects requiring mitigation. The optimized process parameters will result in a processed area or feature having ultra-low visibility as compared to adjacent or separate unprocessed areas. One area of optimization can include laser pulse wavelength. The wavelength of light used to process samples shown in the images herein is 1064 nm, and is generally preferred since such longer wavelength light interacts with the transparent substrate, protective film, or other material or material layers in proximity, less than shorter wavelengths. Other techniques, such as photolithography, often require wavelengths which are more difficult or expensive to produce, such as wavelengths in the visible or UV spectra.

By processing target substrates in accordance with methods herein, various advantages can be realized over conventional manufacturing techniques for processing transparent substrates, as becomes apparent in light of the present disclosure.

III. Laser Patterning of Multi-Layer Structures

Touch sensors typically comprise a film composite of various materials which become stacked together through one or more deposition or lamination processes. A variety of stack-up configurations is possible, and various intermediate processing steps can be implemented during the fabrication of the multiple layers. For example, different multi-layer structures described herein can have layers arranged in a different order than as disclosed in the drawings. In some embodiments, deposited material layers can be disposed on one or both sides of a substrate. In further embodiments, the pulsed laser beam can be incident from the opposite direction as shown. Different types of materials can be used for the different layers, the ones being discussed herein being some suitable examples. It will be appreciated that many different configurations and variations are possible that are within the scope of the present disclosure.

Figure 7A:
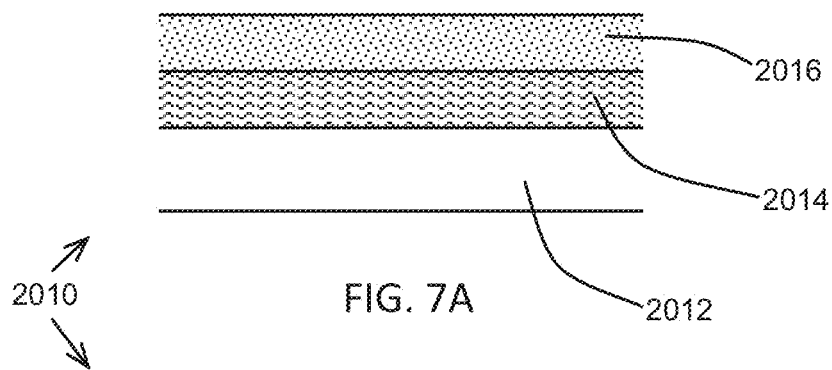
FIGS. 7A-7C show cross-sections of an exemplary stack-up structure at various steps in fabrication, in accordance with an aspect of the present disclosure.
Figure 7B:
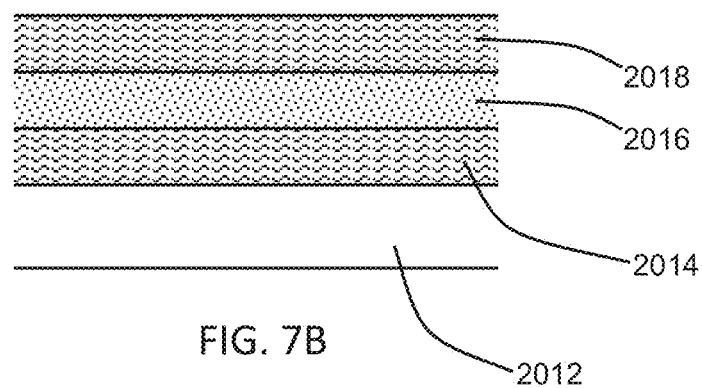
Figure 7C:
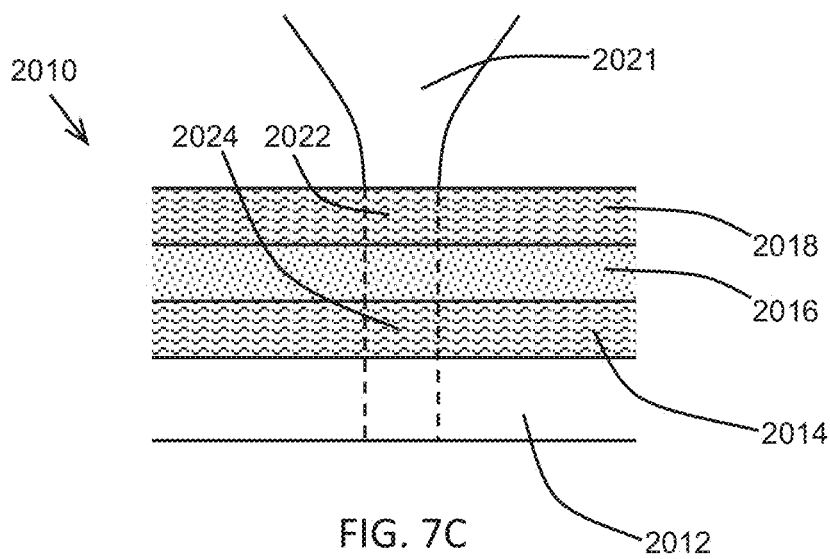

Reference is now made to FIGS. 7A-7C which depicts different stages for methods of non-ablative laser processing a multi-layer stack-up of materials, in accordance with aspects of the present disclosure. In FIG. 7A, a multi-layer stack-up structure 2010 is provided which includes a substrate layer 2012, made of PET or other suitable material. The structure 2010 includes a conductive first layer 2014 disposed on the substrate layer 2012. The first layer 2014 includes silver nanowires, or another suitable conductive material. A second layer 2016, which may be made of photoresist or other suitable insulating material, is disposed on the first layer 2014. Before the insulating layer 2016 is deposited or formed on the first layer 2014, the structure 2010 can be laser processed non-ablatively to form selected non-conductive regions, including lines, patterns, or other geometries, the non-ablative processing being described further hereinafter.

The insulating layer 2016 can include one or more dopants that increase the ability of the layer 2016 to scatter or absorb incident laser energy so as to reduce the amount of residual fluence that is incident on the first layer 2014. In FIG. 7B a third layer 2018 is deposited or formed on the second layer 2016 of the multi-layer structure 2010. The third layer will typically include silver nanowires, though other suitable conductive materials can be used if capable of non-ablative conductivity alteration. One preferred layering is silver nanowires in both the first and third layers 2014,

2018. Silver nanowires offer several advantages over other materials, including the ability to be laser processed non-ablatively (as disclosed herein) and their ability to retain their characteristics under deformation, such as bending loads. For example, silver nanowires are well-suited for application in flexible touch screens. In FIG. 7C, a pulsed laser beam 2021 is generated having process parameters suited for non-ablative alteration of the target. The pulsed laser beam 2021 is directed to the structure 2010 for laser processing of the structure 2010. The pulsed beam 2021 interacts with the third layer 2018 of structure 2010 without ablating a selected portion 2022 of third layer 2018. Through the interaction with the laser pulses from the pulsed laser beam 2021 the conductivity of the selected portion 2022 is changed to non-conductive. At the same time, a selected portion 2024 of the first layer 2014 that is below the third layer 2018 does not experience the same change in conductivity. Additionally, the selected portion 2024 is not ablated by the beam 2021. The insulating layer 2016 can assist in mitigating the pulse energy received by the first layer 2014 in order to prevent a conductivity altering-material interaction.

In FIGS. 8A-8C, another aspect is shown of a laser processing method of a multi-layer stack-up structure 2020 in accordance with an aspect of the present disclosure. In FIG. 8A, a stack-up structure 2020 includes a substrate 2012 and a first layer 2026, the first layer 2026 preferably including silver nanowires. The first layer 2026 is heat treated, represented by the downward facing arrows to alter upward a conductivity changing threshold characteristic of the first layer 2026. Thus, after heat treatment, the threshold for alteration of the conductivity of the first layer 2026 is higher. In some examples, this conductivity altering threshold can be related to an ablation threshold of the material. Various temperatures for heat treatment can be used and the temperature can be selected or adjusted to provide different effects to the first layer 2026. In some examples heat treatment is performed with an oven, a laser, or other heat treating mechanism. The heat treatment of the first layer 2026 can result in an alteration in density of an organic overcoat covering the silver nanowires in the first layer 2026, increasing the fluence threshold thereof. In FIG. 8B, the structure 2020 has undergone subsequent layering steps, providing second layer 2016 on top of first layer 2026, and a third layer 2018 on top of second layer 2016. In FIG. 8C, a pulsed laser beam 2021 is generated having process parameters suited for non-ablative alteration of the target. The pulsed laser beam 2021 is directed to the structure 2020 for laser processing of the structure 2020. The pulsed beam 2021 interacts with the third layer 2018 of structure 2010 without ablating a selected portion 2022 of third layer 2018. Through the interaction with the laser pulses from the pulsed laser beam 2021 the conductivity of the selected portion 2022 is changed to non-conductive. At the same time, a selected portion 2024 of the first layer 2026 that is below the third layer 2018 does not experience the same change in conductivity. Additionally, the selected portion 2024 is not ablated by the beam 2021.

With reference to FIGS. 9A-9C, an aspect is shown of a laser processing method of a multi-layer stack-up structure 2030 in accordance with an aspect of the present disclosure. In FIG. 9A, a stack-up structure 2030 includes a substrate 2012 and a first layer 2028, the first layer 2028 preferably including indium tin oxide. The first layer 2028 can be processed ablatively such that portions of the first layer 2028 are removed through an ablative laser process. A second layer 2016 is deposited on the first layer 2028. In FIG. 9B a third layer 2018 is deposited or formed on the second layer 2016. Third layer 2018 is different from the material composition of the first layer 2028, with third layer 2018 preferably including conductive silver nanowires. Because of the material difference, the third layer 2018 has a conductivity changing threshold characteristic that is different from the first layer 2028. The structure 2030 is processed by a pulsed laser beam 2021 in FIG. 9C. The pulsed laser beam 2021 is generated having process parameters suited for non-ablative alteration of the target. The pulsed laser beam 2021 is directed to the structure 2030 for laser processing of the structure 2030. The pulsed beam 2021 interacts with the third layer 2018 of structure 2010 without ablating a selected portion 2022 thereof. Through the interaction with the laser pulses from the pulsed laser beam 2021 the conductivity of the selected portion 2022 is changed to non-conductive. At the same time, a selected portion 2024 of the first layer 2028 that is below the third layer 2018 does not experience the same change in conductivity. Additionally, the selected portion 2024 is not ablated by the beam 2021.

Conductive regions or layers are processed non-ablatively so they can be used in a touch-sensitive screen in electronic devices or in other devices related to printed electronics or optoelectronics, including devices benefiting from low damage, low visibility processing of substrates or where precision is required. As used herein, "ablative" and "non-ablative" have meanings as presented above.

In some cases, the layers of conductive materials include a random arrangement of silver nanowires. The silver nanowires of such layers can be secured to a substrate in a polymer matrix, such as an organic overcoat. A laser beam can deliver laser pulses to such a layer and create a processed portion where the conductivity of the material of conductive layer is substantially changed such that the processed portion is effectively non-conducting. As used herein, the terms "conductive" and "nonconductive" have meanings attributed to them that are generally understood in the art of printed electronics, touch sensor patterning, or optoelectronics, as set forth in greater detail below.

Laser pulses can be directed to the composite in various patterns such that particular regions and electrical pathways are formed on the substrate. By carefully selecting the characteristics of the laser pulse parameters, including pulse length, pulse fluence, pulse energy, spot size, pulse repetition rate, and scan speed, the substrate may be processed such that electrical characteristics thereof are altered in a predetermined way while the substrate and associated protective and conductive layers are not substantially damaged or structurally altered (e.g., ablatively).

Exemplary laser pulse parameters suitable for non-ablative processing of a conductive layer include a pulse length of about 50 ps, pulse fluence of about 0.17 J/cm$^2$, a spot size of about 40 μm (1/e$^2$), a scan rate of about 1 m/s with a pulse-to-pulse overlap of greater than 90%, a total pulse energy of about 12 μJ, and a pulse repetition rate of about 100 kHz, using optical radiation having a wavelength of 1064 nm (which has been found to interact with the substrate and other materials to a lesser extent than light of shorter wavelengths). Various other parameters are also suitable. For example, pulse repetition rates can be increased to 1 MHz, to 10 MHz, or to greater than 10 MHz to increase processing speeds. Pulse length can be selected to be shorter or longer. Pulse fluence can be adjusted to ensure that the target is processed non-ablatively. Possible pulse lengths include less than about 1 ps, 100 ps, 200 ps, 500 ps, 800 ps, or 1 ns. Other parameters can similarly be varied and optimized accordingly. Laser parameters suitable for non-ablative laser processing can be selected based in part on the relevant properties of the materials selected to be processed. For example, varying thickness of the substrate, the conductive layer, etc., can affect how laser pulse heat is distributed or result in other time-dependent effects requiring mitigation.

While beams for processing are generally brought to a focus at the structure, other beam geometrical configurations and intensity distributions are possible, including an unfocused beam, line beams, square or rectangular beams, as well as beams with uniform, substantially uniform or preselected intensity profiles across one or more transverse axes. In some cases, a composite can be translated to help achieve geometrical features on its surface. In some cases, one or more laser beams impinge on a composite from either a top or back side direction so that the beam propagates through the substrate to the conductive layer such that the beam causes ablative or non-ablative changes to a conductive layer. In some cases, laser pulses cause a processed portion of a conductive layer to become non-conductive without changing the visible characteristics of the processed portion. Similarly, laser pulses can process a conductive border either ablatively or non-ablatively. Laser ablation of a conductive border can be achieved by increasing the energy content of the laser beam incident on the target surface. For example, the laser pulse parameters can be adjusted by increasing the pulse length, pulse fluence, total pulse energy, by using shorter wavelengths, or by decreasing the spot size. Suitable laser systems capable generally include pulsed fiber lasers, pulsed fiber amplifiers, and diode pumped solid-state lasers.

IV. Patterning Conductive Films Using Variable Focal Plane to Control Feature Size In some cases, laser scanning systems can be used to process materials such as composite films for use in electronic devices (e.g., for use as touchscreens in electronic devices). In one exemplary processing scenario, one or more conductive materials (e.g., a layer of silver nanowires and a border of silver paste) can be deposited onto a substrate, and a laser scanning system can be used to process the conductive materials (e.g., to reduce the conductivity of portions of the conductive layer, or to form various features through ablation of the material). The present disclosure provides various advantages over prior touchscreen fabrication processes, including screen printing and/or lithographic techniques. In particular, the present disclosure allows both a main body of a touchscreen and its IC raceways to be processed using a single laser scanning device.

Steps for processing a composite film can be configured so that touch sensitive regions for use in various display devices are formed in the composite film. Other suitable applications for processed materials can include display devices more generally, as well as LED phosphor enhancements, other commercial and consumer lighting applications, wearable electronics, and photovoltaic cells. However, composite films are particularly well-suited for mobile consumer displays, where thinner, more durable, and more flexible formats are highly desirable. When used as a mobile consumer device display, it can be advantageous for a composite film (and thus each layer of material making up the composite film) to be flexible and/or transparent. However, depending on the intended use of the final product, it can be advantageous for a composite film to be at least partially or highly opaque, and/or at least partially or highly rigid. The systems, devices, and processes described herein can be used to process composite films regardless of their transparency and/or rigidity. Composite films can be referred to herein simply as composites.

The substrate used can be formed from a variety of materials. For example, the substrate can be made of polyethylene terephthalate (PET) because of its low cost and advantageous features, including transparency, flexibility, resilience, ease of manufacture, etc. A nonexhaustive list of other possible substrate materials includes polyethylene naphthalate, polyurethane, various plastics, various glasses, and various metals. The substrate can have various thicknesses. For example, the substrate can have a thickness between about 10 µm and 1 mm, or between about 50 µm and 200 µm, or in one specific example, about 130 µm.

In some cases, a flexible and transparent composite material includes a substrate (e.g., PET) with a layer of silver nanowires (also referred to as SNW or AgNW) deposited thereon to a predetermined thickness or to a predetermined conductivity, either of which can be achieved by increasing or decreasing the density of the silver nanowires during composite production. The layer of silver nanowires can have various thicknesses, such as a thickness between about 1 nm and 100 nm, or between about 3 nm and 70 nm, or between about 30 nm and 50 nm. Silver nanowires are well-suited for flexible substrates, as their material properties, such as conductivity and structural integrity, are more consistent under bending loads of various types (e.g., fixedly curved, cyclically deformed, or pliable). In some cases, indium tin oxide (ITO) or other suitable materials can be used instead of silver nanowires.

Figure 10:
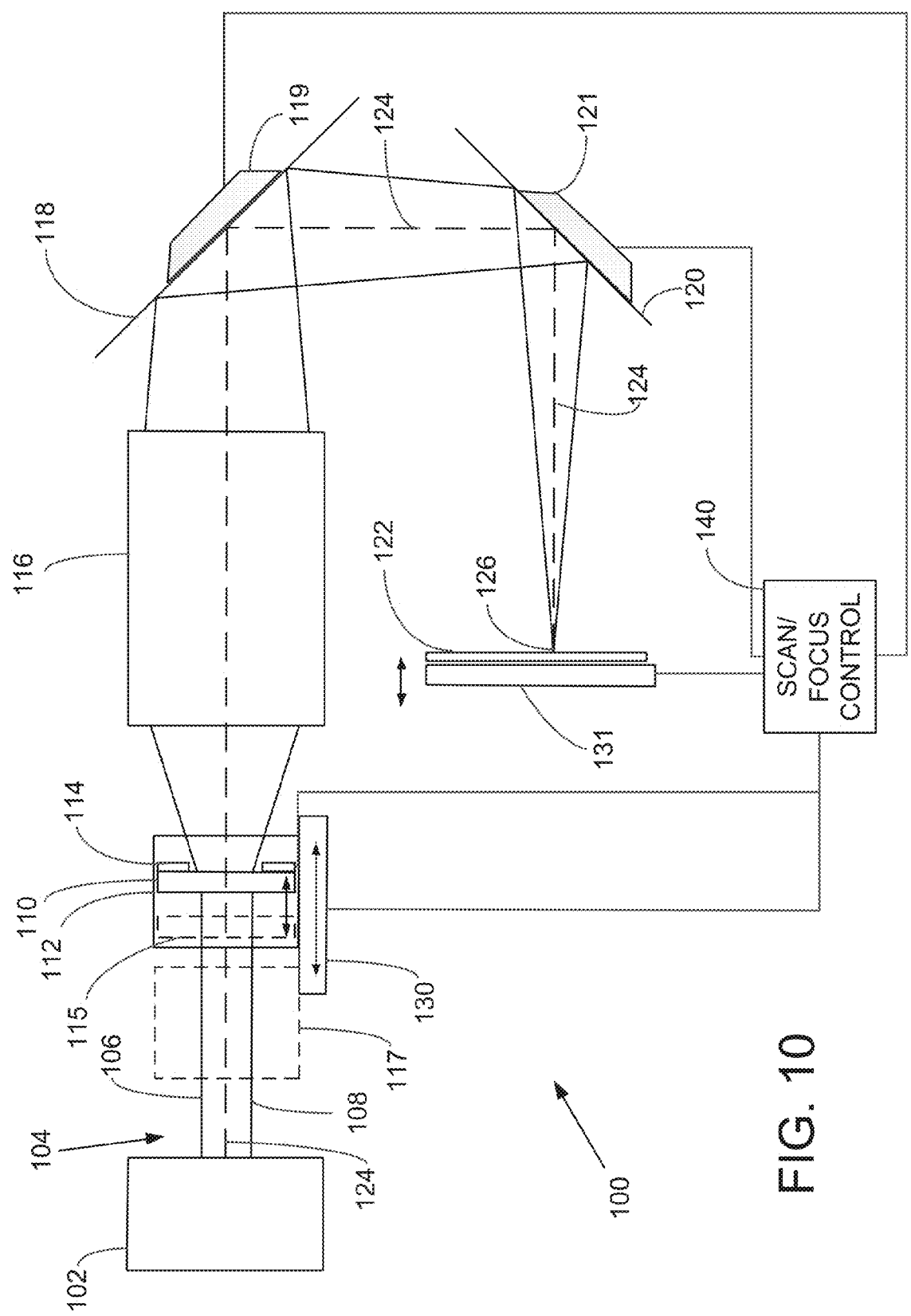
FIG. 10 shows an exemplary laser-based processing system.

FIG. 10 shows one embodiment of a laser scanning system 100. The system 100 includes a source 102 of a laser beam 104, illustrated by a pair of ray lines 106, 108. The laser beam 104 propagates along an optical axis 124, shown in dashed lines, from the source 102 to a focus-control lens 110 that is retained by a housing 112. The lens 110 can be a single optical element such as a plano-concave or double concave lens, or a compound lens that includes two or more single lens elements. In most cases, the focus-control lens 110 produces a diverging beam, but in some examples, the focus-control lens 110 causes the beam 104 to initially converge to a focus, then expand as it propagates away from the focus. Upon exiting the focus-control lens 110, the beam 104 is directed along the optical axis 124 toward an objective lens assembly 116, which converges the beam 104 as it exits the objective lens assembly 116. The converging beam is then directed toward a first reflective surface 118, which reflects the beam 104 toward a second reflective surface 120, which reflects the beam toward a substrate 122 at which the beam 104 is focused at focal point 126. Typically, the beam 104 is focused at some portion of a substrate thickness, but beam focus can be in front of or behind the substrate as well as within the substrate 122.

As shown in FIG. 10, the reflective surfaces 118, 120 of the system 100 can be adjustable in order to steer the beam with respect the substrate 122. As one example, the surfaces 118, 120 can be reflective surfaces coupled to first and second galvanometers 119, 121, respectively, and thus their orientations can be manipulated and controlled using a control system 140 that provides scan and focus control. The control system 140 is also coupled to one or more galvanometers or other focus adjustment mechanisms 114 that displace the focus-control lens 110 along the axis 124. As shown in FIG. 10, the focus-control lens 110 can be moved to a variety of positions, such as a position 115 shown in dashed lines. With such movements, the focus-control lens 110 provides an input beam to the objective lens assembly 116 so that the beam is focused at an acceptable location so as to compensate for non-flat focal planes or curved and/or non-planar substrates.

While the focus-control lens 110 can adjust focus of the beam 104 at the substrate, large beam displacements along the axis 124 are generally not available. Instead, the housing 112 of the focus-control lens 110 is secured to a translation stage 130 so as to move the focus-control lens 110 along the axis 124 to a variety of positions, such as a position 117 shown in dashed lines. These relatively larger motions of the housing 112 and the focus-control lens 110 permit an extended range over which the beam 104 can be focused, and thus permit corresponding variations in beam spot size at a focus location. The substrate 122 is positioned along the axis 124 with a translation stage 131 so that beams of various spot sizes can be focused at the substrate 122. For convenient description, such adjustments of the focus-control lens 110 with the translation stage 130 can be referred to as beam diameter adjustments.

Figure 11:
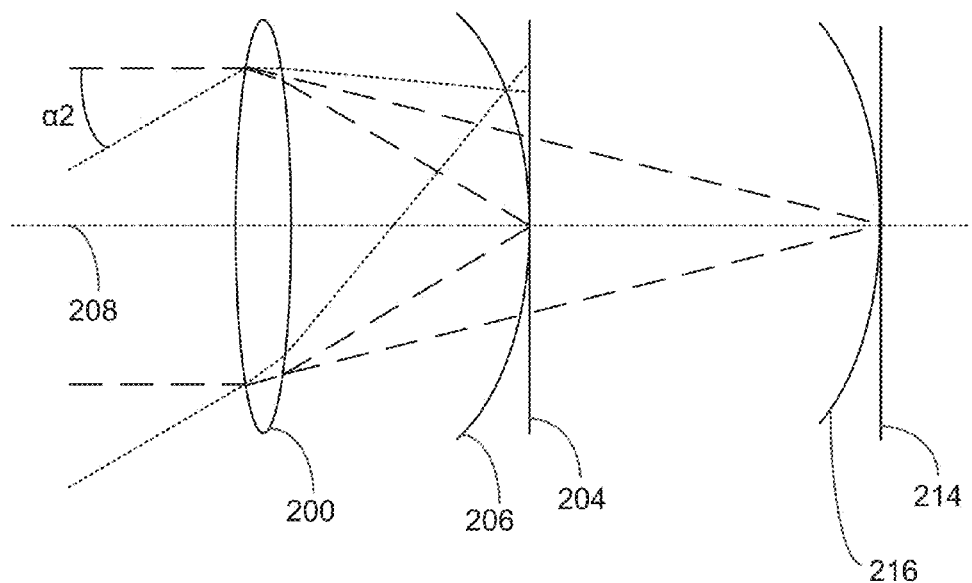
FIG. 11 illustrates displacements associated with beam diameter adjustment.

The system of FIG. 10 permits maintaining focus even across curved or non-planar target surfaces. FIG. 11 illustrates focusing of an optical beam with a system such as the system 100. An objective lens 200 is situated to focus the optical beam along an axis 208. For a fixed lens position, and a beam focus along the axis 208, the beam is generally not in focus across a plane 204 as scanned. Instead, the scanned beam focus defines a curved surface 206. In order to focus on a flat substrate (or substrate of other shape), a focus-control lens is adjusted to establish beam focus on the plane 204 (or other surface). As shown in FIG. 11, typically the greater the angle between ray directions and the axis 208 (i.e., the larger the angle α2 is), the greater this displacement of the actual focus from the plane 204. To vary beam spot size, a focus-control lens is translated with, for example, a translation stage 130 as shown in FIG. 10. With such an adjustment, a beam can be focused with a different beam diameter at an alternative focal plane 214 using a focus-adjust lens to correct the curved field focal surface 216. In this manner, beam focus is accomplished primarily with relatively smaller (and typically faster) focus adjustments while beam spot size is adjusted with relatively large (and typically slower) beam spot size adjustments.

In some systems, servomotors or other motion control devices (or piezoelectric devices, galvanometers, translation stages, etc.) can be situated so as to move a focus-control lens to correct for field curvature and maintain beam focus at a substrate. Additional servomotors (or piezoelectric devices, galvanometers, translation stages, etc.) can be situated to move the focus-control lens to further adjust the location of beam focus along the optical axis, typically to adjust beam diameter.

Figure 12:
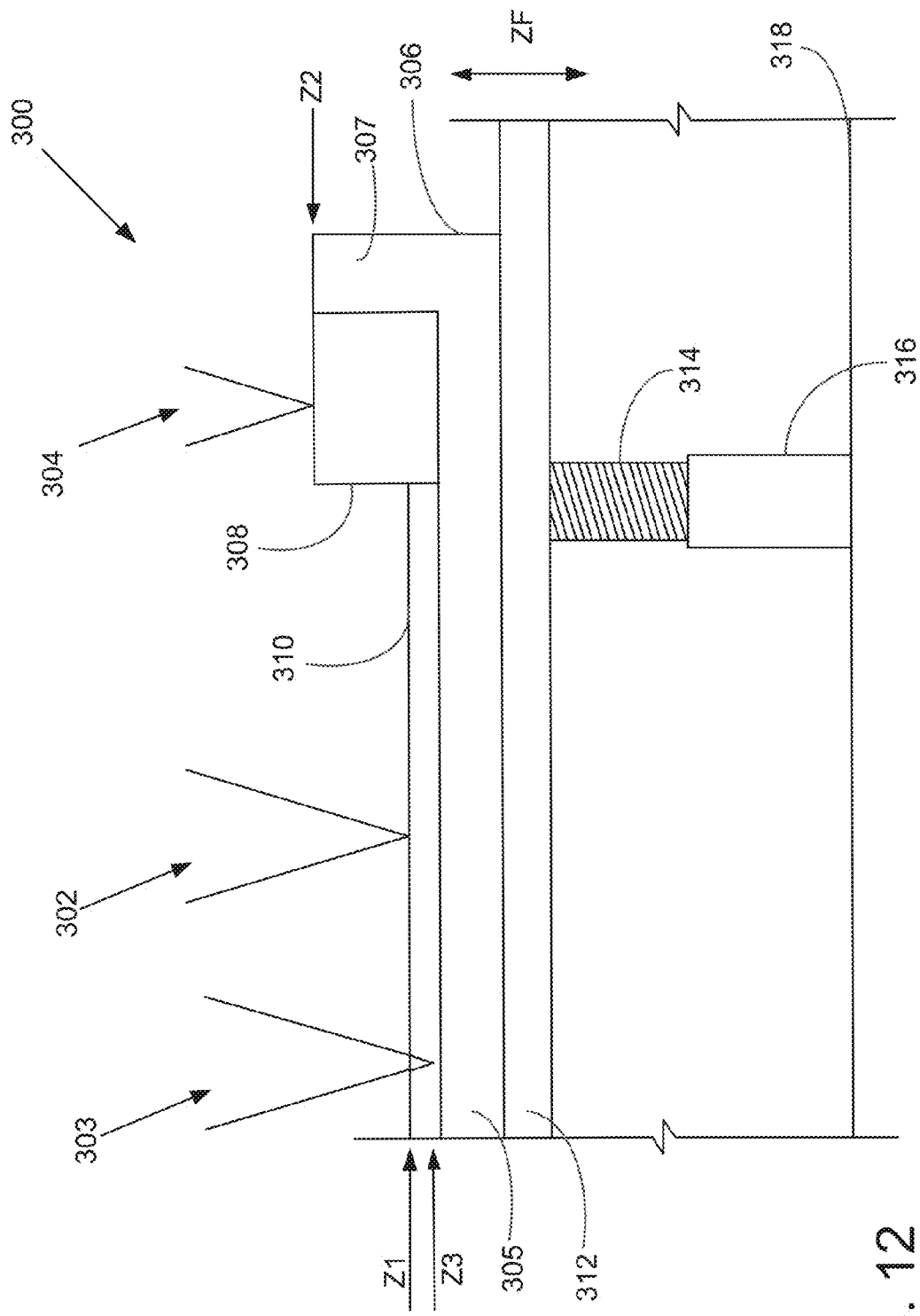
FIG. 12 shows a composite material being processed with a system such as illustrated in FIG. 10.

Referring generally to FIG. 12, a cross-sectional view is shown of three (typically pulsed) laser beams 302, 303, 304, each with selected laser pulse parameters, directed to a composite 300 and focused at different composite features. As shown, the composite 300 includes a substrate 306 having a lower portion 305 and a peripheral lip 307, a peripheral conductive border 308, and a layer 310 of conductive material deposited on a top surface of the substrate 306. In some examples, the substrate 306 has a constant or fixed thickness, or can have a variable thickness, depending upon the application for which the composite is intended. In some examples, the peripheral conductive border 308 comprises a conductive silver paste.

In some embodiments, the composite 300 can be processed to be used as a capacitive touchscreen in electronic devices. In such embodiments, the composite 300 can be transparent such that it can overlay the display of an electronic device to provide touchscreen capabilities without impeding a user's view of the display. The thin layer 310 can comprise the main body of the touchscreen (i.e., it can overlay the display), and the border 308 can comprise one or more integrated circuit (IC) raceways to couple the ICs to the main body of the touchscreen. The ICs can be used to, for example, determine the location(s) of touch events on a touchscreen based on changes in capacitance(s) at various locations on the touchscreen. The raceways couple the IC to the touchscreen itself to enable these determinations.

In various electronic devices, it can be desirable that the thin layer 310 overlay the entirety of the device's display, in order to allow the user to interact with the full extent of the display. Thus, it can be necessary to fit the IC raceways within the bezel of the electronic device. As electronic device bezels are made smaller, it can be advantageous to similarly reduce the size of the IC raceways (so they can fit within the bezel) and to be able to more finely control their properties (e.g., their conductivities and dimensions).

Because the border 308 and the thin layer 310 serve different purposes, they can be processed in different ways to achieve different results. For example, it can be advantageous to non-ablatively process the thin layer 310 such that it maintains a uniform thickness and appearance to a user. However, it can be advantageous to ablatively process the border 308 in order to form the IC raceways from the continuous border 308. Further, the planes z1, z2, and z3, on which the pulsed laser beams 302, 304, and 303, respectively, are focused to process the layer 310 and border 308, are separated from one another along the optical axes of the pulsed laser beams 302, 303, 304. Thus, the techniques described herein, which allow the processing of both the layer 310 and border 308 with a single system, provide various advantages.

As explained above, FIG. 12 illustrates components of a composite being processed by a laser patterning system such as the system 100. In accordance with the foregoing descriptions, the system 100 can be used to process the thin layer 310 and the border 308 in a variety of different ways. For example, the system 100 can be employed to non-ablatively process the thin layer 310, as explained in greater detail below. The system 100 can also be employed to ablatively process the border 308, as also described in further detail below. In such processing steps, movement of the focus-control lens 110 can be automated to correct for field curvature. Movement of the housing 112 can be controlled either manually or through a computer-controlled servo module to control the location of the focal point of a laser beam in the direction of the optical axis of the beam.

Thus, as shown in FIG. 12, a pulsed laser beam 302 can be controlled to be focused on an exposed surface of the thin layer 310 at a focal plane z1, in order to non-ablatively process the layer 310. Similarly, a pulsed laser beam 304 can be controlled to be focused on an exposed surface of the border 308 at a focal plane z2, in order to ablatively process the layer 308. Further, in cases where a laser beam is used to ablatively process the composite 300, the laser beam can be continuously controlled so that it focuses at the surface of the material (which can move as ablation occurs). In some cases, it is desirable to minimize the spot size of the laser beam on the surface it is processing. In such cases, the focal plane of the laser beam is coincident with the exposed surface of the material being processed, as illustrated for laser beams 302 and 304. In other cases, however, larger feature sizes and thus larger spot sizes may be used. In such cases, the focal plane of the laser beam can be offset from the exposed surface of the material being processed along the optical axis of the laser beam, as illustrated for laser beam 303. Thus, the scanning laser systems described herein allow for adjustment of feature sizes.

In some cases, a distance between a laser scanning system and a surface of a material to be processed can be adjusted to, for example, increase the distance to provide a larger field size, to decrease the distance to improve accuracy, or to vary focused spot size. Thus, in some cases, a material to be processed by a laser scanning system can be situated on an adjustable surface, which can be moved to adjust the distance between the scanning system and the surface to be processed. For example, as shown in FIG. 12, the composite 300 can be situated on a platform 312, which can be adjustable along an axis ZF. Various mechanisms can be used to adjust the platform 312 along the ZF axis. As one example, the platform can be coupled to one or more threaded rods 314 threaded into respective hollow tubes 316 having corresponding threads on inner surfaces. Thus, rotation of the tubes 316 causes motion of the platform 312 and thus the composite 300 along the axis ZF. The tubes 316 can be supported on a base unit 318. Of course, any other translation mechanisms can be used as well.

Figure 13:
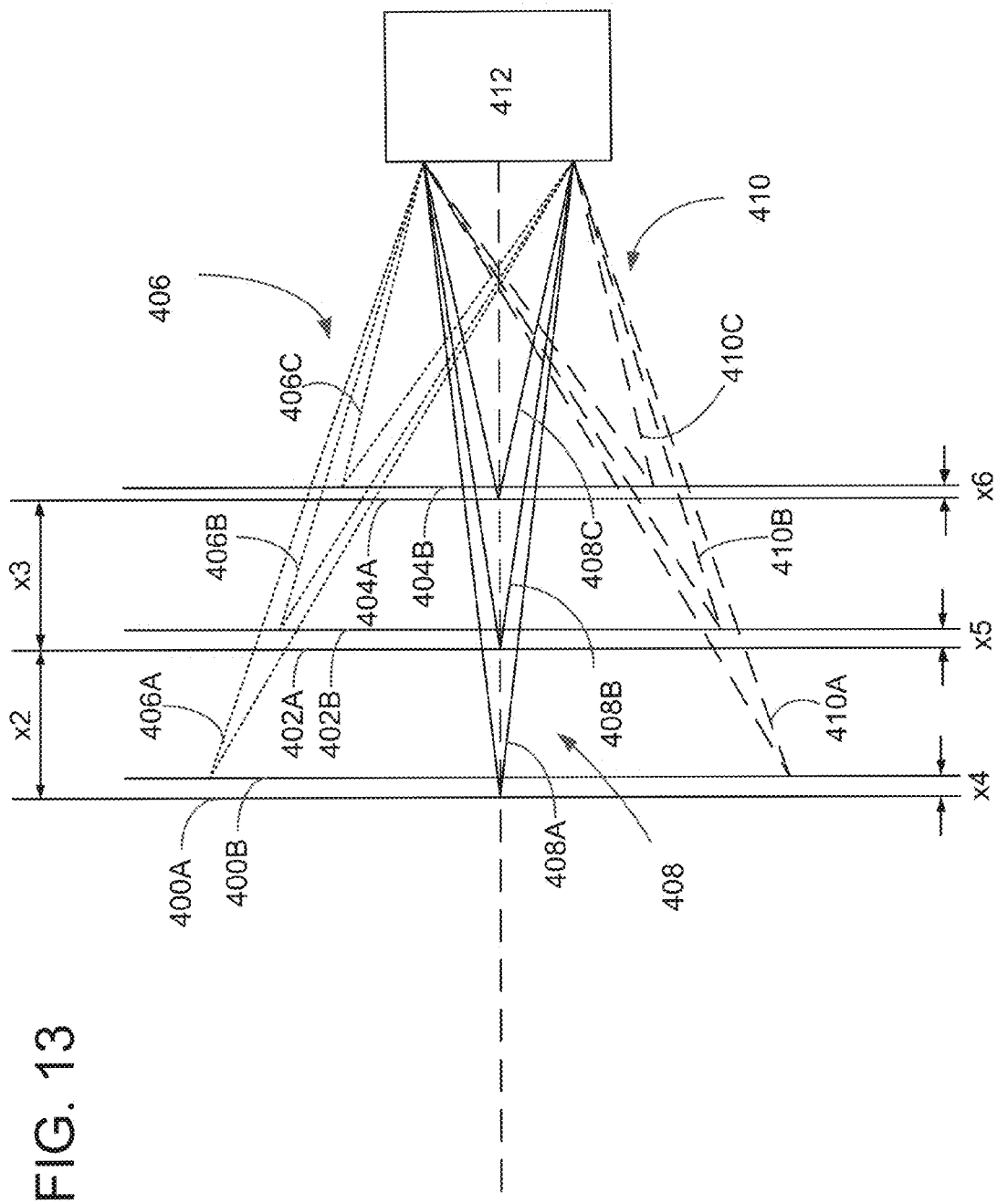
FIG. 13 illustrates focal regions associated with different beam diameters.

FIG. 13 shows laser beams 406, 408, 410, each propagating along different axes as directed by a laser scanning system 412, which can have a configuration similar to that of system 100. Each of the laser beams 406, 408, 410, is shown in three different configurations (as beams 406A, 406B, 406C or 408A, 408B, 408C, or 410A, 410B, 410C, respectively): in a first configuration focused on a first focal plane 400A or 400B (i.e., as shown at 406A, 408A, and 410A), in a second configuration focused on a second focal plane 402A or 402B (i.e., as shown at 406B, 408B, and 410B), and in a third configuration focused on a third focal plane 404A or 404B (i.e., as shown at 406C, 408C, and 410C). Focal plane 400A is farther from the system 412 than focal plane 402A by a distance x2, and focal plane 402A is farther from the system 412 than focal plane 404A by the distance x3. The distances x4, x5, x6 typically correspond to different focus locations corresponding to field curvature in an objective lens. Thus, an objective lens may form a beam focus for a target portion of a substrate situated on the objective lens axis at the plane 400A; absent a focus adjustment, the beam incident to an off-axis target portion would be focused on the plane 400B. As noted above, a focus-control lens can be provided to adjust focal position to compensate.

Displacements x2, x3 are generally provided to correspond to larger translations of a focus-control lens so as to produce beam spot size changes. The displacements x2, x3 are generally unequal, and a beam spot size as focused at the plane 400A is typically larger than a beam spot size at the plane 402A which is in turn larger than a beam spot size for focus at the plane 404A. As shown in FIG. 12, a processing system is configured to provide focus adjustments (x4, x5, x6) at locations associated with different beam spot sizes (i.e., at displacements x2, x3).

Figure 14:
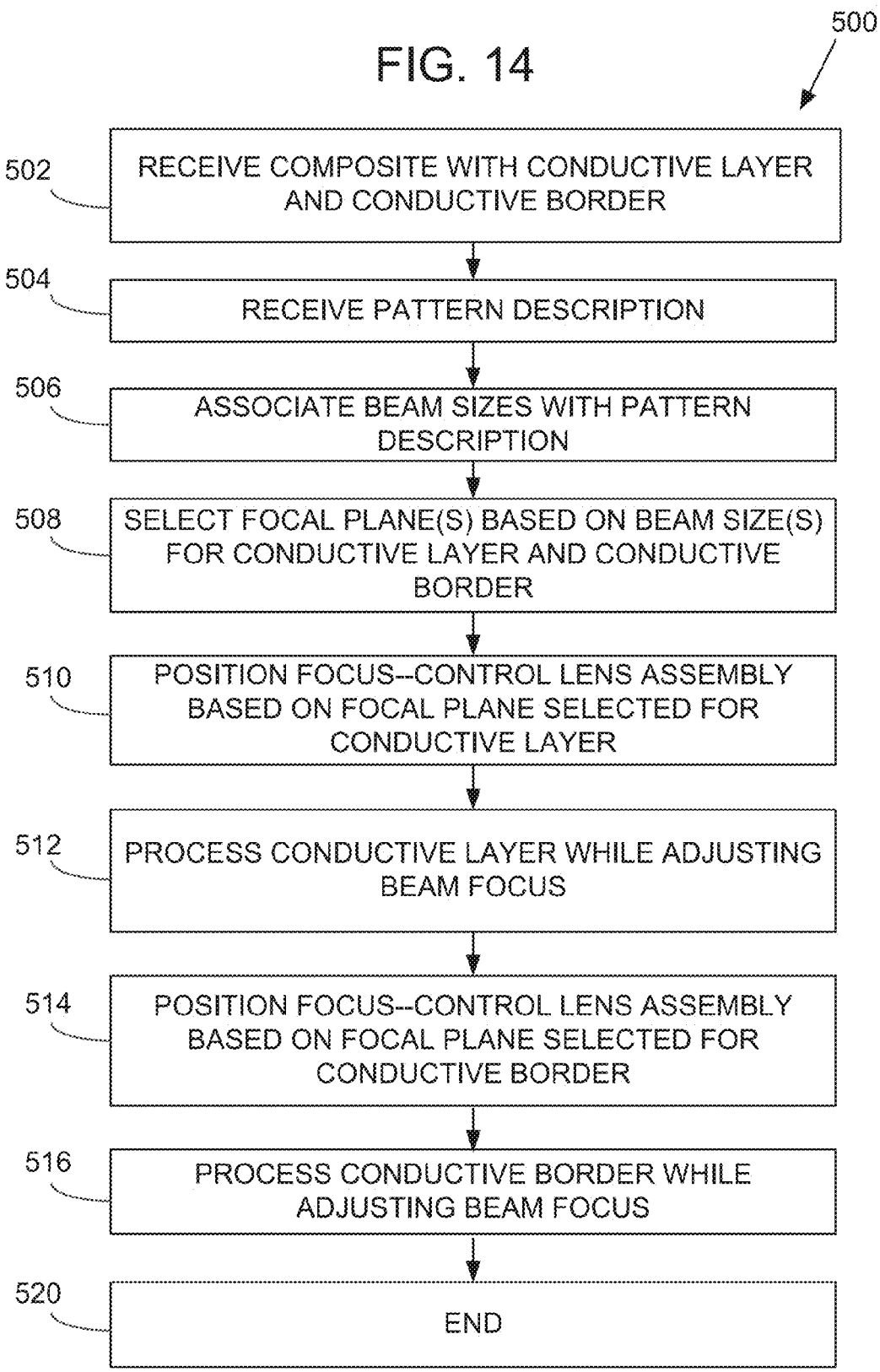
FIG. 14 shows a method of processing a composite material.

FIG. 14 shows an exemplary method 500 for processing a composite such as a composite to be processed for use as a touchscreen in an electronic device. At 502, a composite that includes a substrate having a conductive layer and a conductive border formed thereon is selected. At 504, a pattern or process description is obtained that indicates how various portions of the composite are to be processed, and can include pattern layouts, dwell times, feature sizes, types of processing (e.g., ablation or other processes). At 506, processing beam parameters such a power, wavelength, pulse repetition rate, pulse energy, and beam spot size are associated with the pattern description. At 508, focal planes (or working distances) are selected to produce the selected beam spot sizes. At 510, a focus-control assembly is positioned so that a beam from the focus-control assembly is focused to a suitable beam spot size at the selected focal plane. As shown in FIG. 14, the focal plane is selected for processing the conductive layer. At 512, the conductive layer (or other substrate regions) is processed with the selected spot size/working distance with focus control provided by a focus-control lens. At 514, a focus-control assembly is positioned so that a beam from the focus-control assembly is focused to another suitable beam spot size at another selected focal plane. As shown in FIG. 14, this focal plane is selected for processing the conductive border. At 516, the conductive border (or other substrate region) is processed with the selected spot size/working distance with focus control provided by a focus-control lens. Processing terminates at 520. A plurality of different working distances and beam spot sizes can be used, based on the pattern description. While a range of beam spot sizes can be used, such as beam diameters of between 2 µm and 10 mm, 4 µm and 1 mm, 5 µm and 0.5 mm, or 8 µm and 0.2 mm, typical beam spot sizes are between 10 µm and 100 µm. These beams can generally process composites that include conductive silver paste or silver nanowires to have features of corresponding sizes.

Ablative and Non-Ablative Processing of the Conductive Layer and Border

In some cases, the conductive layer is processed non-ablatively so it can be used as a touch-sensitive screen in electronic devices and the conductive border is processed ablatively so that it forms IC raceways leading from the touch-sensitive screen to an integrated circuit. In alternative embodiments, however, either the conductive layer or the conductive border can be either ablatively or non-ablatively processed, as is suitable for the particular embodiment. As used herein, "ablative" and "non-ablative" have meanings as presented above.

In some cases, the layers of conductive materials includes a random arrangement of silver nanowires. The silver nanowires of such layers can be secured to a substrate in a polymer matrix, such as an organic overcoat. A laser beam can deliver laser pulses to such a layer and create a processed portion where the conductivity of the material of conductive layer is substantially changed such that the processed portion is effectively non-conducting. As used herein, the terms "conductive" and "nonconductive" have meanings attributed to them that are generally understood in the art of printed electronics, touch sensor patterning, or optoelectronics. For example, suitable sheet resistances for a material such that it may be considered conductive include 30-250 Ω/sq, and suitable sheet resistances or electrical isolation measurements for a material such that the material may be considered non-conductive or electrically isolated include resistances greater than or equal to about 20 MΩ/sq. However, these sheet resistances are merely examples, and other conductive and non-conductive ranges may apply depending on the requirements of the particular application. Some processed substrates may be considered sufficiently conductive with sheet resistances below 500 Ω/sq, 1 kΩ/sq, 5 kΩ/sq, or 10 kΩ/sq, and may be considered non-conductive with sheet resistances greater than or equal to about 100 kΩ/sq, 1 MΩ/sq, or 100 MΩ/sq.

Laser pulses can be directed to the composite in various patterns such that particular regions and electrical pathways are formed on the substrate. By carefully selecting the characteristics of the laser pulse parameters, including pulse length, pulse fluence, pulse energy, spot size, pulse repetition rate, and scan speed, the substrate may be processed such that electrical characteristics thereof are altered in a predetermined way while the substrate and associated protective and conductive layers are not substantially damaged or structurally altered (e.g., ablatively).

Exemplary laser pulse parameters suitable for non-ablative processing of a conductive layer include a pulse length of about 50 ps, pulse fluence of about 0.17 $J/cm^2$, a spot size of about 40 μm ($1/e^2$), a scan rate of about 1 m/s with a pulse-to-pulse overlap of greater than 90%, a total pulse energy of about 12 μJ, and a pulse repetition rate of about 100 kHz, using optical radiation having a wavelength of 1064 nm (which has been found to interact with the substrate and other materials to a lesser extent than light of shorter wavelengths). Various other parameters are also suitable. For example, pulse repetition rates can be increased to 1 MHz, to 10 MHz, or to greater than 10 MHz to increase processing speeds. Pulse length can be selected to be shorter or longer. Pulse fluence can be adjusted to ensure that the target is processed non-ablatively. Possible pulse lengths include less than about 1 ps, 100 ps, 200 ps, 500 ps, 800 ps, or 1 ns. Other parameters can similarly be varied and optimized accordingly. Laser parameters suitable for non-ablative laser processing can be selected based in part on the relevant properties of the materials selected to be processed. For example, varying thickness of the substrate, the conductive layer, etc., can affect how laser pulse heat is distributed or result in other time-dependent effects requiring mitigation.

While the beams are generally described as being brought to a focus, other beam geometrical configurations and intensity distributions are possible, including an unfocused beam, line beams, square or rectangular beams, as well as beams with uniform, substantially uniform or preselected intensity profiles across one or more transverse axes. In some cases, a composite can be translated to help achieve geometrical features on its surface. In some cases, one or more laser beams impinge on a composite from either a top or back side direction so that the beam propagates through the substrate to the conductive layer such that the beam causes ablative or non-ablative changes to a conductive layer. In some cases, laser pulses cause a processed portion of a conductive layer to become non-conductive without changing the visible characteristics of the processed portion. Similarly, laser pulses can process a conductive border either ablatively or non-ablatively. Laser ablation of a conductive border can be achieved by increasing the energy content of the laser beam incident on the target surface. For example, the laser pulse parameters can be adjusted by increasing the pulse length, pulse fluence, total pulse energy, by using shorter wavelengths, or by decreasing the spot size. Suitable laser systems capable generally include pulsed fiber lasers, pulsed fiber amplifiers, and diode pumped solid-state lasers.

Exemplary Control System and Computing Environment

Figure 15:
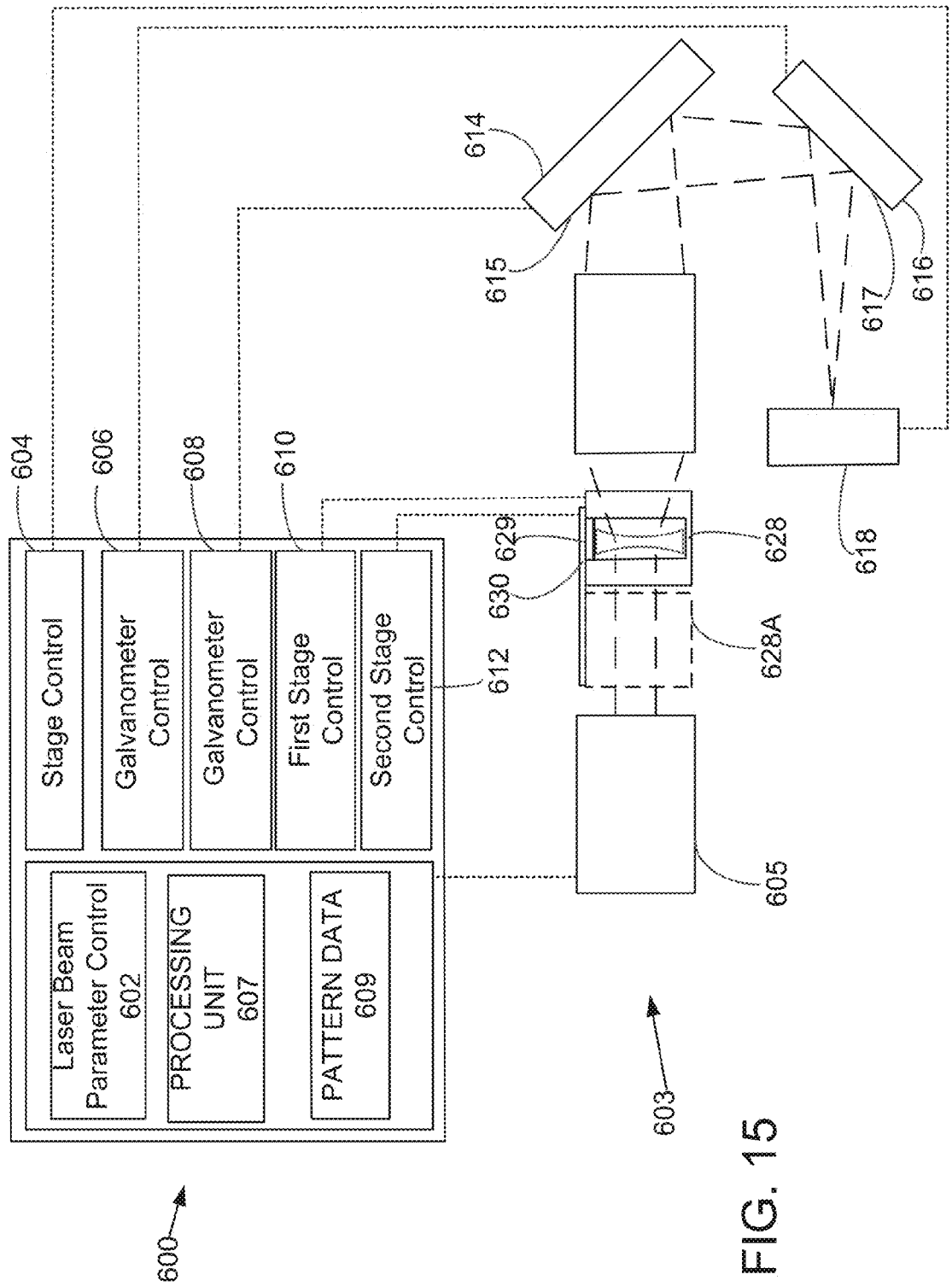
FIG. 15 shows an exemplary processing system that includes a control system and a laser scanning system.

FIG. 15 shows an exemplary laser processing system that includes a control system 600 for controlling a laser beam delivery system 603. As shown, the control system 600 can include a laser beam parameter control interface 602, a stage control interface 604, two galvanometer control interfaces 606 and 608 for controlling the scanning of a laser beam, and first and second stage control interfaces 610, 612. The laser beam parameter control interface 602 can be coupled to a source of a laser beam such as source 605, and can control parameters of the laser beam generated thereby, such as pulse length, pulse fluence, pulse energy, pulse light wavelength, etc. Typically, the control system 600 includes one or more processors 607 and a memory 609 that retains pattern data and instructions for processing pattern data for determining laser scan parameters. The control interfaces are typically implemented based on computer-executable instructions stored in one or more computer readable storage media such as magnetic disks or memory such random access memory.

The stage control interface 604 can be coupled to a substrate stage 618, which can control the location of a composite to be processed. The substrate stage 618 can comprise any of a variety of motion control devices such as piezoelectric or motorized scanning devices. The galvanometer control interfaces 606, 608 can be coupled to galvanometers 616, 614, respectively, which can control reflective surfaces 617, 615, respectively. The first and second stage control interfaces 610, 612, can be coupled to motion control devices 629, 630, respectively, and can control linear motion of the stages along an optical axis. The motion control device 629 is coupled to a focus-adjust assembly 628 so that beam focus can be maintained during beam scanning. The focus-adjust assembly 628 is secured to the motion control device 630 so as to select a suitable beam diameter for substrate processing. One additional location of the focus-adjust assembly 628 is shown at 628A. Adjustments of the focus-adjust assembly 628 with the motion control device 630 are generally accompanied with corresponding movement of the substrate 618 so that beam focus at a different beam diameter is achieved, while focus over a scan field can be maintained with the motion control device 629.

Figure 16:
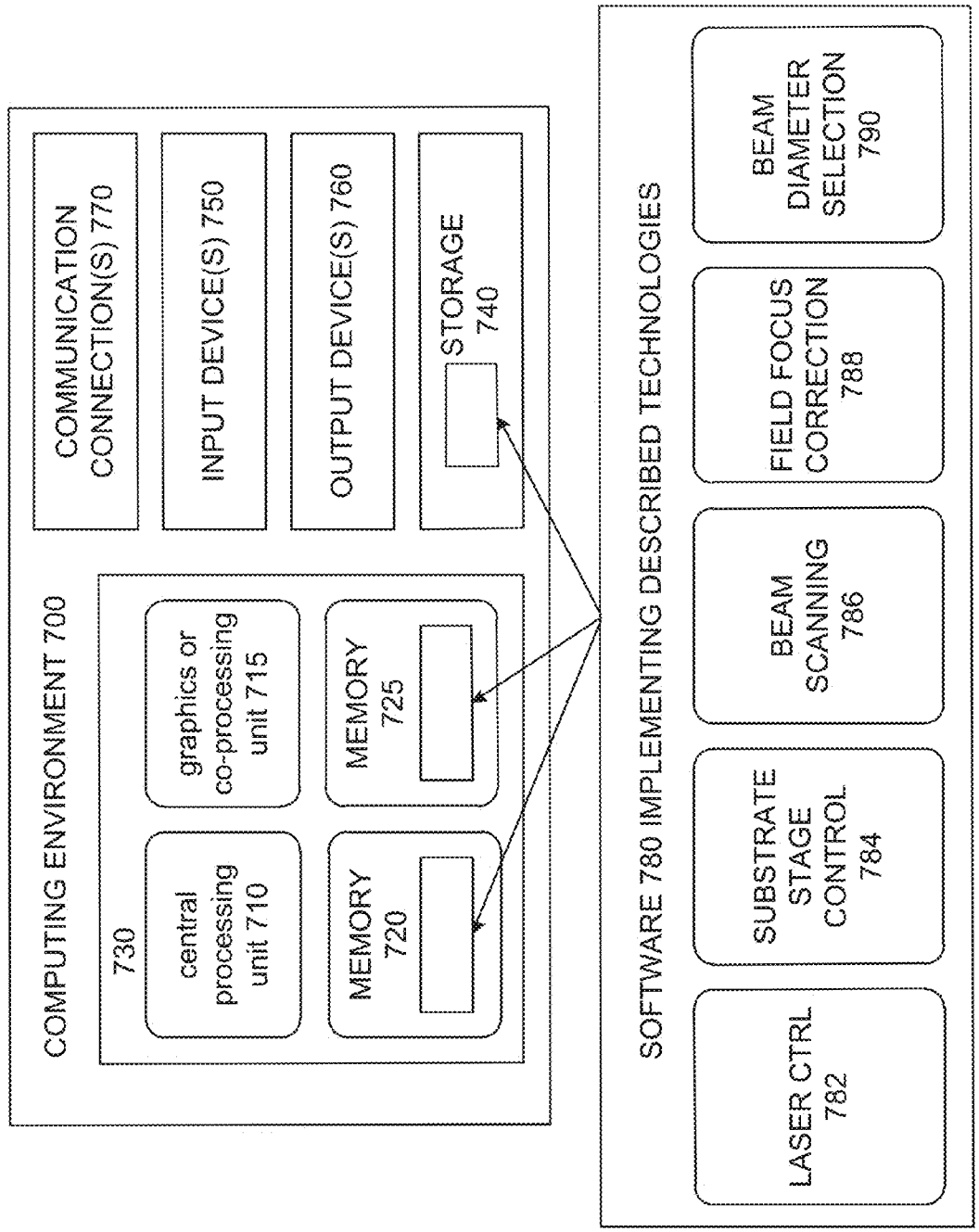
FIG. 16 shows an exemplary computing environment configured to control substrate processing with focus control and beam diameter adjustment.

FIG. 16 depicts a generalized example of a suitable computing environment 700 in which the described innovations may be implemented. The computing environment 700 is not intended to suggest any limitation as to scope of use or functionality, as the innovations may be implemented in diverse general-purpose or special-purpose computing systems. For example, the computing environment 700 can be any of a variety of computing devices (e.g., desktop computer, laptop computer, server computer, tablet computer, media player, gaming system, mobile device, etc.)

With reference to FIG. 16, the computing environment 700 includes a basic configuration 730 including one or more processing units 710, 715 and memory 720, 725. The processing units 710, 715 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 16 shows a central processing unit 710 as well as a graphics processing unit or co-processing unit 715. The tangible memory 720, 725 may be volatile memory (e.g., registers, cache, RAM), non-volatile memory (e.g., ROM, EEPROM, flash memory, etc.), or some combination of the two, accessible by the processing unit(s). The memory 720, 725 stores software 780 implementing one or more innovations described herein, in the form of computer-executable instructions suitable for execution by the processing unit(s).

A computing system may have additional features. For example, the computing environment 700 includes storage 740, one or more input devices 750, one or more output devices 760, and one or more communication connections 770. An interconnection mechanism (not shown) such as a bus, controller, or network interconnects the components of the computing environment 700. Typically, operating system software (not shown) provides an operating environment for other software executing in the computing environment 700, and coordinates activities of the components of the computing environment 700.

The tangible storage 740 may be removable or non-removable, and includes magnetic disks, magnetic tapes or cassettes, CD-ROMs, DVDs, or any other medium which can be used to store information in a non-transitory way and which can be accessed within the computing environment 700. The storage 740 stores instructions for the software 780 implementing one or more innovations described herein.

The input device(s) 750 may be a touch input device such as a keyboard, mouse, pen, or trackball, a voice input device, a scanning device, or another device that provides input to the computing environment 700. For video encoding, the input device(s) 750 may be a camera, video card, TV tuner card, or similar device that accepts video input in analog or digital form, or a CD-ROM or CD-RW that reads video samples into the computing environment 700. The output device(s) 760 may be a display, printer, speaker, CD-writer, or another device that provides output from the computing environment 700.

The communication connection(s) 770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Software 780 can include one or more software modules. For example, software 780 can include a laser beam software module 782 for setting laser beam parameters and/or controlling a source of a laser beam, a substrate stage motion module 784 for setting substrate position along an axis and controlling a substrate stage, and a beam scanning module 786 for determining parameters of a beam scanning system and/or controlling such a beam scanning system. One exemplary beam scanning system can include a pair of galvanometers. A focus control module 780 can also include a field focus correction module 788 for determining actions to be taken to correct for field curvature such as by motion of a focus-adjust lens. A beam diameter module 790 can control movements to focus a beam at a particular distance to obtain a selected beam diameter.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

Figure 17:
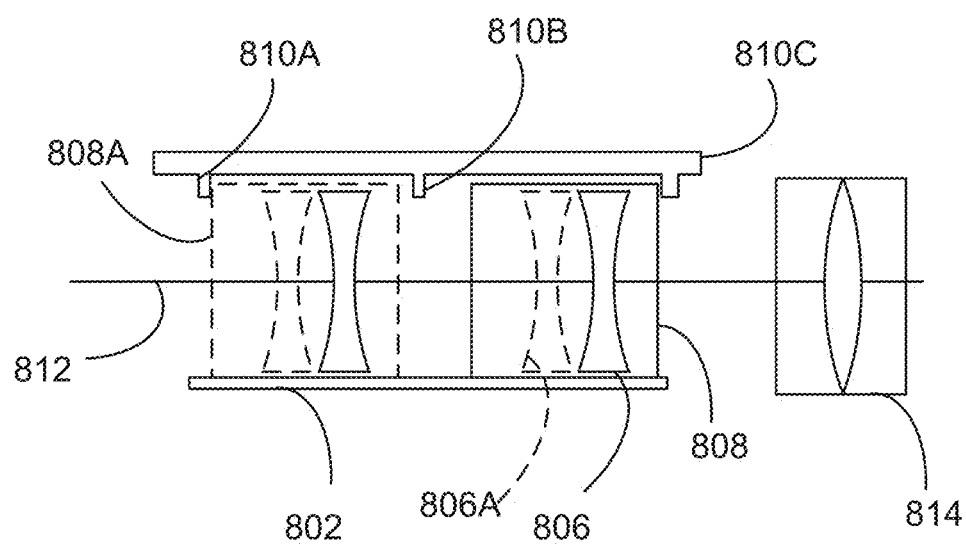
FIG. 17 illustrates a representative assembly for adjusting beam diameter.

FIG. 17 illustrates a focus assembly 808 that is translatable to fixed positions (such as 808A) based on assembly stops 810A-810C. A stage 802 translates the focus assembly 808 along an axis 812 of an objective lens 814. The focus assembly 808 includes a lens 806 that is translatable within the focus assembly 808 to adjust a beam focus location established by the objective lens 814 so as to compensate field curvature or non-planar substrates. One representative location of the lens 806 is shown at 806A.

V. Optimization of High Resolution Digitally Encoded Laser Scanners for Fine Feature Marking An important characteristic of laser scanning systems is the resolution (used herein to refer to the minimum distance between two distinguishable points) they can achieve. Conventional laser scanning systems have attempted to improve resolution by reducing the working distance between the laser scanner and the surface being scanned, resulting in smaller resolution scanning over a smaller scanning field. In order to maintain large-field scanning capabilities, the conventional systems have employed expensive translatable stages to translate the surface being scanned, such that a plurality of small fields can be scanned adjacent one another on a surface to form a large field. These conventional systems have several deficiencies.

Previous laser scanning systems have typically used 16-bit laser scanners, reduced the working distance until a desired resolution is achieved, and then scanned a plurality of small fields, relying on a translatable stage to move the surface being scanned relative to the scanner. It has been found that by using 20-bit scanners, improved resolutions (e.g., by a factor of 16) can be achieved using similar techniques. Alternatively, it has also been found that by using 20-bit scanners, similar resolutions can be achieved at larger working distances, thereby reducing or eliminating the need to scan plural fields and therefore the need to translate the surface being scanned relative to the scanner. This provides several distinct and significant advantages over conventional systems. For example, significantly smaller resolution scanning can be achieved. Further, by reducing or eliminating the need to stitch together many small scan fields, errors introduced in the stitching process are reduced or eliminated.

Figure 18:
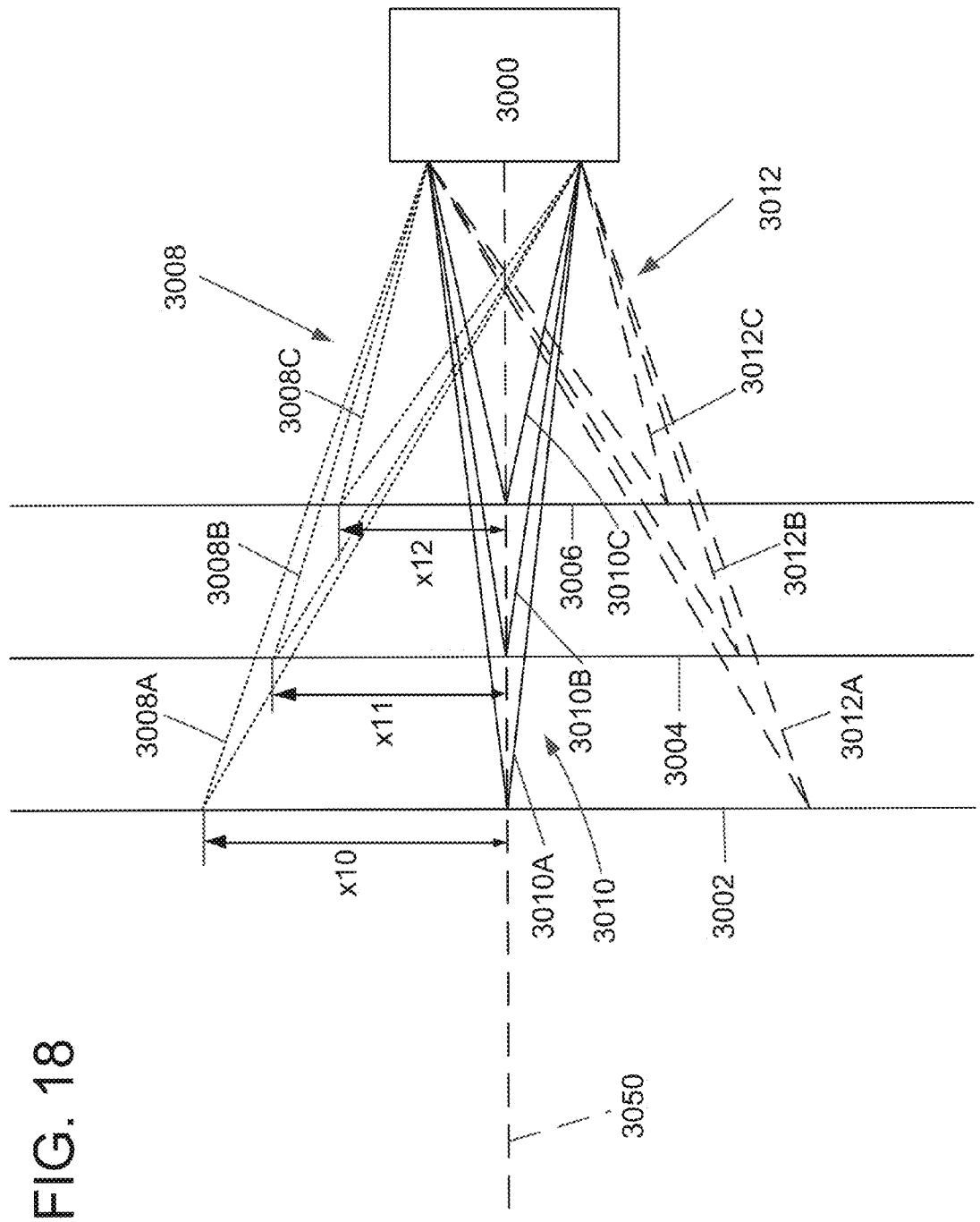
FIG. 18 illustrates a laser scanning system and three focal planes.

FIG. 18 shows a digital laser scanning system 3000 (such as a 20-bit laser scanning system) and laser beams 3008, 3010, and 3012, each propagating along different axes as directed by the system 3000. Each of the laser beams 3008, 3010, 3012 is shown in three different configurations (as beams 3008A, 3008B, 3008C or 3010A, 3010B, 3010C, or 3012A, 3012B, 3012C, respectively): in a first configuration focused on a first focal plane 3002 (i.e., as shown at 3008A, 3010A, and 3012A), in a second configuration focused on a second focal plane 3004 (i.e., as shown at 3008B, 3010B, and 3012B), and in a third configuration focused on a third focal plane 3006 (i.e., as shown at 3008C, 3010C, and 3012C). Focal plane 3002 is farther from the system 3000 than focal plane 3004, and focal plane 3004 is farther from the system 3000 than focal plane 3006.

The digital laser scanning system 3000 generally produces an angular deflection $\alpha$ that is digitally specified by a predetermined number of bits. For example, the digital laser scanning system 3000 can specify deflection angles based on n bits, wherein n is an integer such as 8, 16, 18, 20, or larger. An n-bit digital laser scanning system can identify $2^n$ distinct deflection angles. A transverse displacement d on a selected focal plane is generally proportional to a product of the angular deflection $\alpha$ and focal plane distance along an axis 3050. A transverse displacement resolution (for a fixed angular deflection difference) is defined as the associated difference in transverse displacement.

As shown in FIG. 18, the transverse displacement resolution at the focal plane 3006 is smaller than the transverse displacement resolution at focal plane 3004, which is smaller than the transverse displacement resolution at focal plane 3002. That is, as the working distance from the system 3000 increases, transverse displacement resolution increases. Because focal plane 3002 is farther from the system 3000 than focal plane 3004 and focal plane 3004 is farther from the system 3000 than focal plane 3006, the transverse displacement resolutions x10>x11>x12. Using a 20-bit scanning system rather than a 16-bit scanning system, desirable resolutions can be achieved at working distances large enough to allow the scanning of a scan field as large as one square meter without translating the scanned surface relative to the scanning system and stitching plural smaller scan fields together to form a larger scan field. More specifically, a 20-bit scanning system is capable of scanning a one square meter scan field with a resolution of less than one micrometer.

The system 3000 can include a laser configured to produce a processing beam, an optical system, and a scan controller configured to receive a scan pattern and couple scan control signals to the optical system. In some cases, the scan pattern can be defined as a plurality of scan vectors. In some cases, the scan control signals can control the optical system to direct the processing beam to a scan area with a predetermined beam diameter. In some cases, the scan controller is configured to couple scan control signals to the optical system to control the optical system to scan the processing beam across, or with respect to, the scan area, so as to produce at least one exposed scan vector. In some cases, a transverse offset between the exposed scan vector and an intended scan vector is less than $1/10$, or less than $1/20$, of the predetermined beam diameter. In some cases, the scan control signals correspond to the scan vectors to within an accuracy of at least $1/2^{16}$ (0.0015%), such as about $1/2^{17}$ (0.00076%), or about $1/2^{18}$ (0.00038%), or about $1/2^{19}$ (0.00019%), or about $1/2^{20}$ (0.000095%).

Table 1 shows more specifically the resolution achievable, in μm/bit, with a variety of scanning systems for several field sizes. In particular, Table 1 shows the specific advantages of the 20-bit scanning system over a 16-bit scanning system for square fields having sides of different lengths.

TABLE 1

Resolution as a Function of Given Field Sizes

| | Square Field Edge Length | | | | | |
|---|---|---|---|---|---|---|
| # Bits | 0.1 m | 0.25 m | 0.5 m | 0.75 m | 1.0 m | 1.2 m |
| 10 | 98 | 244 | 488 | 732 | 976 | 1172 |
| 12 | 24 | 61 | 122 | 183 | 244 | 293 |
| 14 | 6.1 | 15.3 | 31 | 46 | 61 | 73 |
| 16 | 1.53 | 3.81 | 7.6 | 11 | 15 | 18 |
| 18 | 0.38 | 0.95 | 1.9 | 2.9 | 3.8 | 4.6 |
| 20 | 0.095 | 0.2384 | 0.48 | 0.72 | 0.95 | 1.14 |
| 22 | 0.024 | 0.06 | 0.12 | 0.18 | 0.24 | 0.29 |
| 24 | 0.0006 | 0.015 | 0.03 | 0.04 | 0.06 | 0.072 |

Figure 19A:
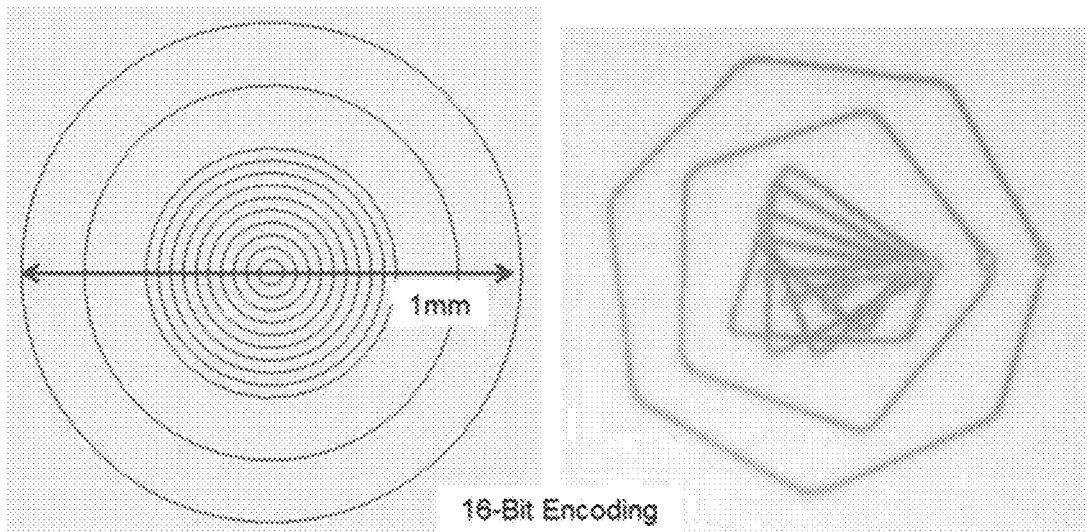
FIGS. 19A and 19B each illustrate an input pattern and a pattern actually scanned by a laser scanning system.
Figure 19B:
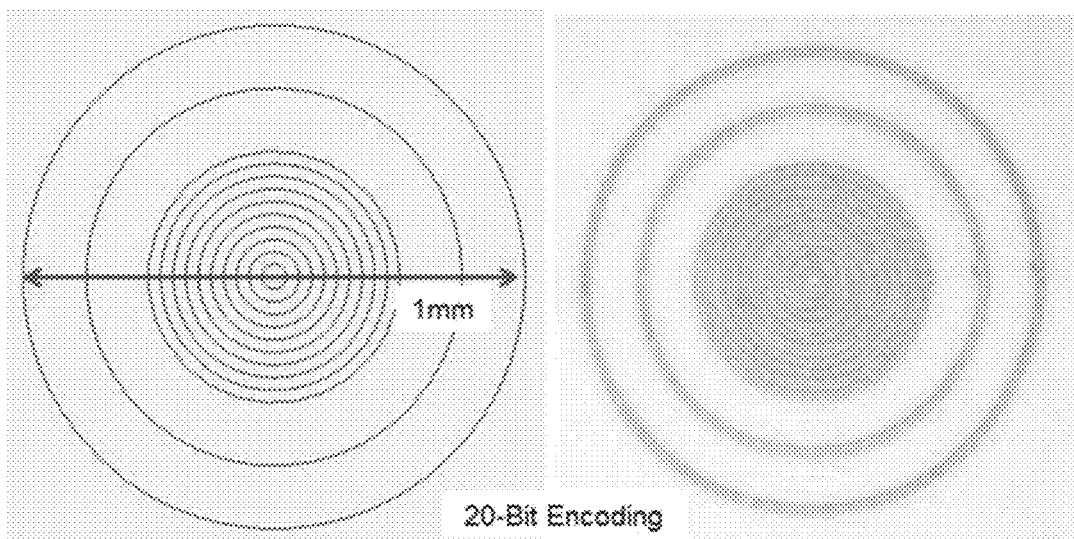

FIGS. 19A and 19B show the resolution achievable with a 16-bit scanning system and with a 20-bit scanning system, respectively. The left images of FIGS. 19A and 19B show an input pattern of concentric circles, the largest of which has a diameter of 1 mm. The right images of FIGS. 19A and 19B show the patterns actually scanned by 16-bit and 20-bit scanning systems, respectively, in response to the input pattern of concentric circles. These patterns were scanned using the same optical system, laser, and scanner (operating in both 16-bit and 20-bit modes), onto photo-sensitive paper. Based on the field size used in these examples, the transverse displacement resolution of the 16-bit scanning system was 9.2 μm, and the transverse displacement resolution of the 20-bit scanning system was 0.6 μm. The results of these experiments clearly illustrate the improved scanning resolution of the 20-bit scanning system. With higher transverse displacement resolution, shapes can be transferred to a substrate more accurately.

Figure 20B:
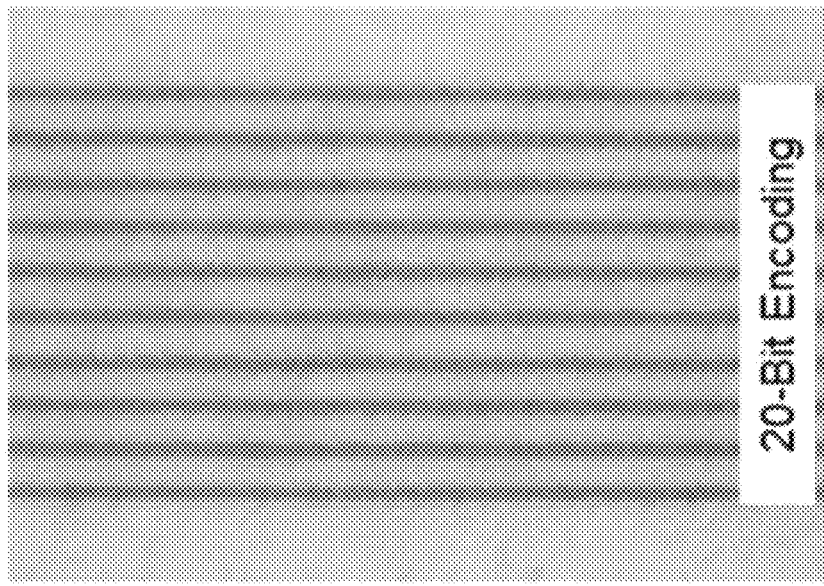
FIGS. 20A and 20B each illustrate several lines scanned by a laser scanning system.
Figure 20A:
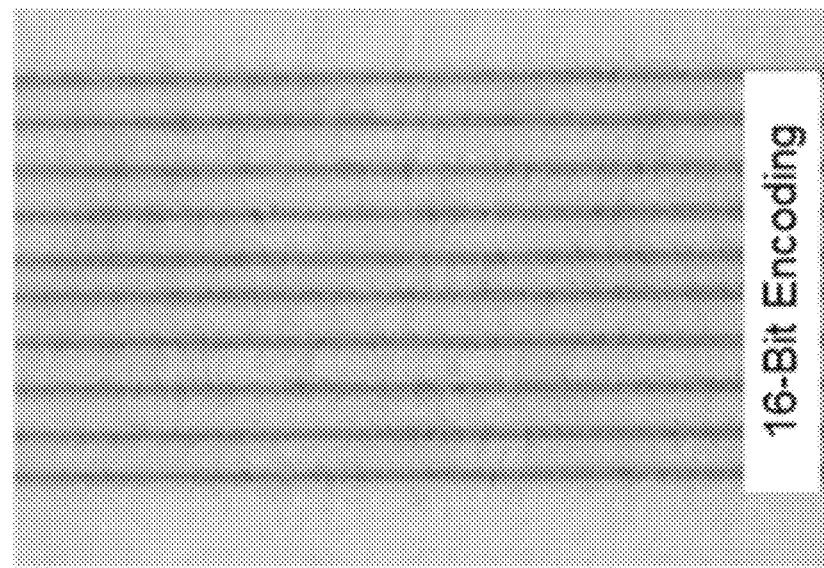

Thus, a 20-bit scanning system can provide smaller laser scribe lines with smaller scanning pitches (used herein to refer to the smallest achievable center-to-center distances between features) than known scanning systems, and can reduce quantization errors associated with beam placement due to single bit accuracy limitations. In particular, to scan a 20 μm scribe line with a 40 μm pitch over a 0.5 m×0.5 m field, a 16-bit scanning system provides only 5 to 6 bits (at 7.6 μm/bit) between scribe lines. Decreasing the scribe width to 10 μm and pitch to 20 μm, a 16-bit system can provide only 2-3 bits between scribes, leading to significant quantization of beam placement and related errors (e.g., the spacing between features is less consistent). In contrast, to scan a 10 μm scribe with a 20 μm pitch over a 0.5 m×0.5 m field, a 20-bit scanning system can provide between 41 and 42 bits between scribe lines, significantly reducing quantization effects. FIGS. 20A and 20B illustrate this improvement. FIG. 20A illustrates several lines scanned by a 16-bit scanning system at a 100 μm pitch and FIG. 20B illustrates the same input pattern scanned by a 20-bit scanning system. The improvement in spacing consistency is visually discernible.

Further testing was conducted to evaluate improvements provided by 20-bit scanning. FIG. 21 illustrates an input pattern scanned by both a 16-bit and a 20-bit scanning system, with the numbers shown in FIG. 21 indicating the pitch, in mm, of the associated pattern. The pitches of the scanned features were measured under high magnification, with results presented in Table 2 for each of the patterns (either lines or corners having a given spacing).

TABLE 2

Measured Pitches of Scanned Features

| | 30 μm (Lines) | | 50 μm (Lines) | | 80 μm (Lines) | | 100 μm (Lines) | | 70.7 μm (Corners) | | 141.4 μm (Corners) | |
|---|---|---|---|---|---|---|---|---|---|---|---|---|
| # Bits | 16 | 20 | 16 | 20 | 16 | 20 | 16 | 20 | 16 | 20 | 16 | 20 |
| Max Meas. (μm) | 36.4 | 31.5 | 55.6 | 51.2 | 90.6 | 81.6 | 110.5 | 102 | 87.9 | 72.7 | 155.8 | 143.3 |
| Min Meas. (μm) | 26.8 | 28.9 | 41.2 | 49.4 | 73.4 | 78 | 85.6 | 97.6 | 59 | 69.4 | 127.7 | 139.4 |
| Max − Min (μm) | 9.6 | 2.6 | 14.4 | 1.8 | 17.2 | 3.6 | 24.9 | 4.4 | 28.9 | 3.3 | 28.1 | 3.9 |
| Avg. Meas. (μm) | 29.7 | 30.1 | 48.9 | 50.1 | 80.4 | 80.2 | 99.7 | 100 | 71.4 | 70.9 | 141.4 | 141.7 |
| Std. Dev. (μm) | 3.7 | 0.8 | 5.7 | 0.6 | 6.6 | 1 | 9 | 1.2 | 12 | 0.9 | 10 | 1.1 |

Table 2 sets forth measurements of the pitches of scanned features, including the maximum spacings, minimum spacings, differences between the minimum and maximum spacings, average spacings, and standard deviations of spacings, for the six different patterns patterned with both 16-bit and a 20-bit scanning. Spacings of corner features were measured on a diagonal between corners, and thus the nominal distance for the features having a 50 μm pitch is 70.7 μm and the nominal distance for the features having a 100 μm pitch is 141.4 μm. As shown in Table 2, 20-bit scanning had consistently and significantly better performance than 16-bit scanning. In particular, all standard deviations of 20-bit measurements are within twice single bit resolution limits.

Figure 22:
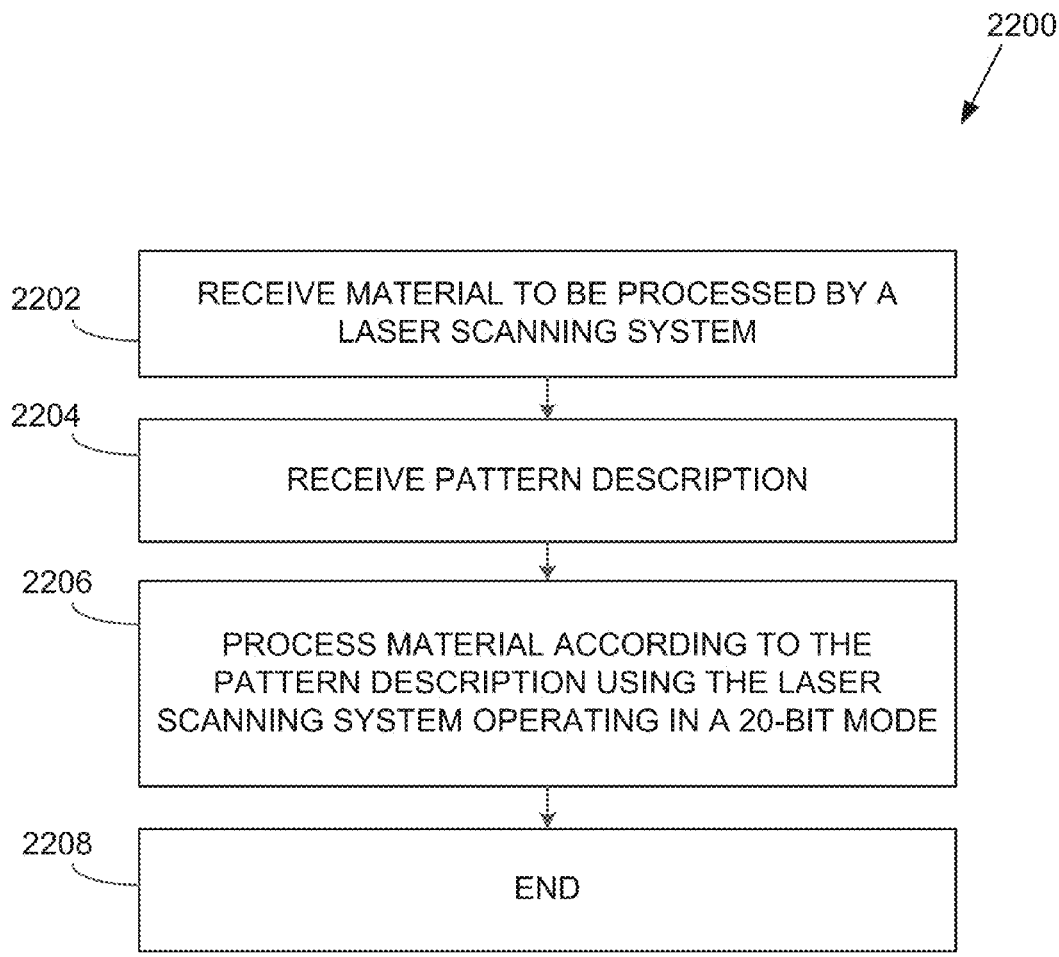
FIG. 22 illustrates an exemplary method.

FIG. 22 illustrates an exemplary method 2200 by which materials can be processed. At 2202, a material to be processed by a laser scanning system is received. At 2204, a description of a pattern to be scanned onto the material is received. At 2206, the material is processed according to the pattern description using the laser scanning system and the laser scanning system is operated so as to have 20-bit angular resolution. At 2208, processing terminates. In some cases, the method is used to process a scan field of at least one square meter with a single laser scanner and without translating the material with respect to the scanner.

Another exemplary method can include receiving a pattern description defining one or more pattern features, which can be associated with respective scan vectors. The method can further include selecting a laser beam diameter and directing a laser beam having the selected or an otherwise predetermined beam diameter over a scan area of a substrate based on the pattern description. In some cases, the laser beam can be directed over the scan area with a transverse displacement resolution that is less than 1/10 of the beam diameter. In some cases, the laser beam can be directed over the scan area with a transverse displacement resolution that is less than 1/20 of the beam diameter. The scan area can be square, rectangular, circular, or can have any other suitable shape.

Another exemplary method can include selecting a laser beam diameter (e.g., between about 10 μm and 100 μm), and situating a substrate on a scan plane at a desired working distance from a source of a laser beam such that the laser beam has the selected diameter at the scan plane. In some cases, the scan plane can be associated with the selected laser beam diameter, for example, the working distance can be determined based on the selected diameter. The method can further include exposing the substrate to the laser beam by scanning the laser beam across, or with respect to, the substrate. In some cases, the laser beam can be scanned with angular scan increments corresponding to less than 1/10, or less than 1/20, or less than 1/100, or less than 1/1000 of the selected laser beam diameter.

A 20-bit scanning system can improve resolution to such a degree that the scanning system is no longer the limiting factor in the achievable resolution. For example, equipment used to calibrate the scanning system may not be capable of calibrating to within the resolution achievable by the scanning system. As another example, thermal and/or vibratory effects, as well as beam steering and/or material limitations may introduce errors larger than the resolution achievable by the scanning system. A 20-bit (or other) laser scanning system can use multi-point extrapolation and averaging to place a beam across a scan field to realize further improvements over 16-bit encoding. Optical radiation of any suitable wavelength or range of wavelengths, such as ultraviolet, visible, infrared, or other wavelengths can be used. In some embodiments, a laser scanning system can be used to scan a two-dimensional surface such that the resolution of the scanning pattern along a first axis is the same as the resolution of the scanning pattern along a second axis. In alternative embodiments, a laser scanning system can be used to scan a two-dimensional surface such that the resolution of the scanning pattern along a first axis is larger than the resolution of the scanning pattern along a second axis.

The systems and methods described herein provide substantial advantages. For example, the systems and methods described herein can achieve more precise laser patterning of a material. The systems and methods described herein can allow laser patterning of a significantly larger scan field with similar or better resolution than prior systems and methods. In particular, the systems and methods described herein can allow laser scanning of a scan field of larger than one square meter with a resolution of less than one μm, without requiring translation of material and stitching of a plurality of scan fields to form a larger composite scan field. This reduces or eliminates errors introduced by translatable stages and stitching processes. This also reduces the time needed to scan large fields, thereby reducing overall production time, and eliminates the need for expensive translatable stages, reducing overall production costs.

In some embodiments, multiple 20-bit laser scanners can be used in an array to simultaneously scan a surface to achieve even larger scan fields and/or even smaller resolution than with a single 20-bit scanner. This technique can further reduce the processing time required by processing multiple regions in parallel rather than in series (requiring additional time for translation). In some embodiments, one or more 20-bit laser scanning systems can be used to scan portions of a surface of a material, after which the material can be translated with respect to the one or more scanning systems (e.g., on one or more translatable stages) so the scanning systems can scan different portions of the surface of the material. This technique can also be used to achieve even larger scan fields and/or even smaller resolution.

In embodiments in which multiple 20-bit scanning systems are used to scan multiple scan fields of a surface, and in embodiments in which a 20-bit scanning system is used in combination with a translatable stage to scan multiple scan fields of a surface, multiple scan fields can be stitched together to form a larger composite scan field. For example, if multiple 20-bit scanning systems are used, each of the scanning systems can be provided with a vision system, and the surface can be provided with several fiducial marks placed in the field of view of the vision system. The vision system can use the fiducial marks to identify regions of the surface the scanning systems have been assigned to scan and to align scans from different scanning systems, if desired. As another example, if a 20-bit scanning system is used in combination with a translatable stage to scan multiple scan fields, the vision system can use the fiducial marks to identify each of the multiple scan fields to align the multiple scan fields to form a larger composite scan field. Because a 20-bit scanning system provides greatly improved resolution, multiple fields can be aligned ("stitched" together) with much greater accuracy.

In some cases, computer systems can be provided with computer-executable instructions stored in one or more computer readable media that implement computer-executable methods that optimize or otherwise arrange the order in which vectors of a scan pattern are scanned by a laser scanning system. Such methods and systems can reduce the time required to scan a surface and thus overall processing time. Optimization algorithms used by such methods provide greater efficiency as numbers of vectors in a scan pattern increases. Thus, it has been found that these methods are particularly valuable for large scan fields because larger scan fields typically include larger numbers of vectors to be drawn.

As noted above, 20-bit scanning systems can be used to process materials to be used as capacitive touchscreens in electronic devices such as cell phones or tablets. In such embodiments, a large scan field can be used to fabricate multiple touchscreens from a common substrate in a single scanning session. A large scan field can also be used to fabricate large touchscreens.

VI. Conclusion

In view of the many possible embodiments to which the principles of the present disclosure may be applied, it should be recognized that the illustrated embodiments are only preferred examples and should not be taken as limiting the scope of the disclosure. We claim all that comes within the scope and spirit of the appended claims.

I claim:

1. A method, comprising:
  receiving a pattern description stored in at least one computer readable storage medium, the pattern description comprising a definition of at least one pattern feature associated with a scan vector that is associated with a laser beam deflection angle; and
  directing a laser beam over a fixed scan area based on the pattern description, wherein the laser beam is directed over the fixed scan area with a transverse displacement resolution that is less than $1/20$ of a laser beam diameter.

2. The method of claim 1, wherein an area of the fixed scan area is at least one square meter.

3. The method of claim 2, wherein the transverse displacement resolution is less than 1 µm.

4. The method of claim 1, wherein the fixed scan area is square or circular.

5. The method of claim 4, further comprising directing the laser beam over a substrate situated in the fixed scan area, wherein at least one of a laser beam power, pulse energy, pulse repetition rate, and laser beam diameter is selected so as to process the substrate.

6. The method of claim 1, wherein the transverse displacement resolution is less than 0.5 µm.

7. The method of claim 6, wherein the fixed scan area is square and has an area of at least one quarter square meter.

8. The method of claim 1, wherein directing the laser beam includes using multi-point extrapolation and averaging to direct the laser beam.

9. An apparatus, comprising:
  a laser configured to produce a processing beam;
  an optical system; and
  a scan controller configured to receive a pattern description, the pattern description comprising a definition of at least one pattern feature associated with a scan vector that is associated with a laser beam deflection angle;
  wherein the scan controller is configured to control the optical system to scan the processing beam with respect to a scan area so as to direct the processing beam over the scan area based on the pattern description to generate a pattern according to the pattern description, wherein the processing beam is directed over the scan area with a transverse displacement resolution that is less than $1/10$ of a processing beam diameter.

10. The apparatus of claim 9, wherein the scan area is rectangular and the transverse offset is less than $1/10^5$ of a scan area length.

11. The apparatus of claim 9, wherein the scan area is rectangular and the transverse offset is less than $1/10^6$ of a scan area length.

12. The apparatus of claim 9, wherein the scan controller couples scan control signals to the optical system so that the scan control signals correspond to the scan vectors to within at least 0.0015%.

13. The apparatus of claim 9, wherein the scan controller couples scan control signals to the optical system so that the scan control signals correspond to the scan vectors to within at least 0.0008%.

14. The apparatus of claim 9, wherein the scan controller couples scan control signals to the optical system so that the scan control signals correspond to the scan vectors to within at least 0.0004%.

15. The apparatus of claim 9, wherein the scan controller couples scan control signals to the optical system so that the scan control signals correspond to the scan vectors to within at least 0.0001%.

16. The method of claim 1, further comprising:
  selecting a laser beam diameter;
  situating a substrate to be scanned in the fixed scan area, wherein the fixed scan area is associated with the a scan plane having a selected laser beam diameter; and exposing the substrate to a laser beam with the selected laser beam diameter, wherein the laser beam is directed over the fixed scan area by scanning the laser beam with angular scan increments corresponding to less than $1/10$ of the laser beam diameter at the fixed scan area.

17. The method of claim 16, wherein the laser beam is scanned with angular scan increments corresponding to less than $1/100$ of the laser beam diameter at the scan plane.

18. The method of claim 16, wherein the laser beam is scanned with angular scan increments corresponding to less than $1/1000$ of the laser beam diameter at the scan plane.

19. The method of claim 16, wherein the selected laser beam diameter is between 10 μm and 100 μm.

20. The method of claim 16, wherein the fixed scan area is at least 1 square meter.

* * * * *